United States Patent [19]
Katori et al.

[11] Patent Number: 6,011,284
[45] Date of Patent: Jan. 4, 2000

[54] ELECTRONIC MATERIAL, ITS MANUFACTURING METHOD, DIELECTRIC CAPACITOR, NONVOLATILE MEMORY AND SEMICONDUCTOR DEVICE

[75] Inventors: Kenji Katori; Nicolas Nagel; Koji Watanabe; Masahiro Tanaka, all of Kanagawa, Japan

[73] Assignee: Sony Corporation, Tokyo, Japan

[21] Appl. No.: 08/995,845

[22] Filed: Dec. 22, 1997

[30] Foreign Application Priority Data

| Dec. 26, 1996 | [JP] | Japan | 8-348581 |
| Dec. 26, 1996 | [JP] | Japan | 8-348582 |
| Apr. 30, 1997 | [JP] | Japan | 9-112849 |
| Apr. 30, 1997 | [JP] | Japan | 9-112850 |

[51] Int. Cl.$^7$ .......... H01L 29/76; H01L 29/94; H01L 27/108; H01L 31/119
[52] U.S. Cl. .......... 257/295; 257/296; 257/306
[58] Field of Search .......... 257/295–296, 257/306–310; 438/243–253, 396–399; 361/302–305, 310–312

[56] References Cited

U.S. PATENT DOCUMENTS 5,157,540  10/1992  Kidai et al. .............. 359/273
5,293,510   3/1994  Takenaka ................. 257/295
5,598,293   1/1997  Green .................... 359/275

*Primary Examiner*—Minh Loan Tran
*Assistant Examiner*—Chong Quang Nguyen
*Attorney, Agent, or Firm*—Hill & Simpson

[57] ABSTRACT

An electronic material is expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100. A dielectric capacitor comprises: a diffusion preventing layer made of the material expressed by the composition formula $M_{Ia}M_{IIb}O_c$; a lower electrode on the diffusion preventing layer; a dielectric film on the lower electrode; and an upper electrode on the dielectric film. Another dielectric capacitor comprises: a diffusion preventing layer made of a material expressed by the composition formula $M_{Ia}M_{IIb}O_c$ (where a, b and c are compositions in atomic %, $M_{II}$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100; a lower electrode on the diffusion preventing layer; a dielectric film on the lower electrode; and an upper electrode on the dielectric film.

62 Claims, 11 Drawing Sheets

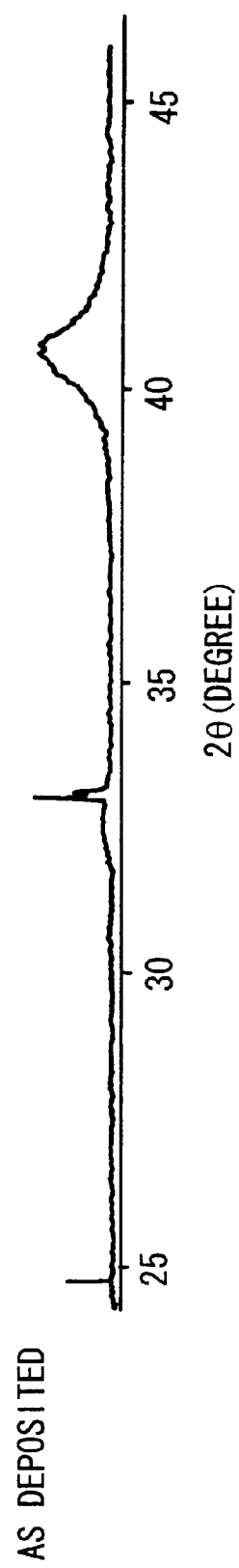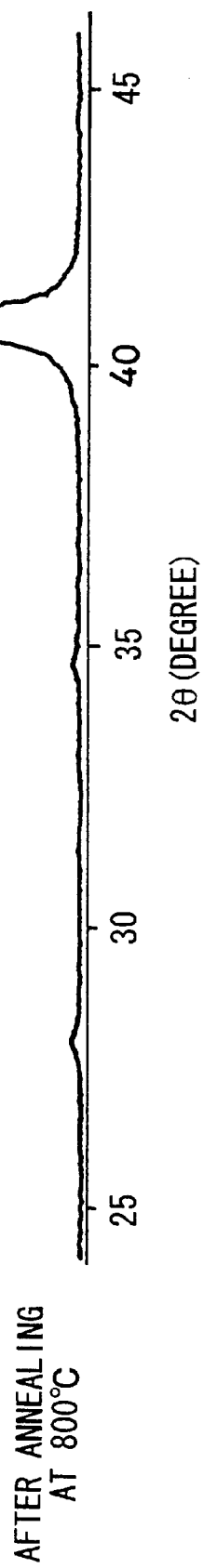
Fig. 1A AS DEPOSITED
Fig. 1B AFTER ANNEALING AT 800°C

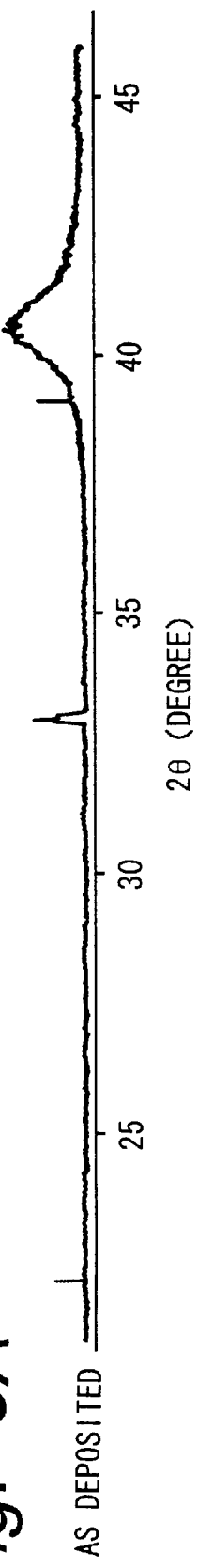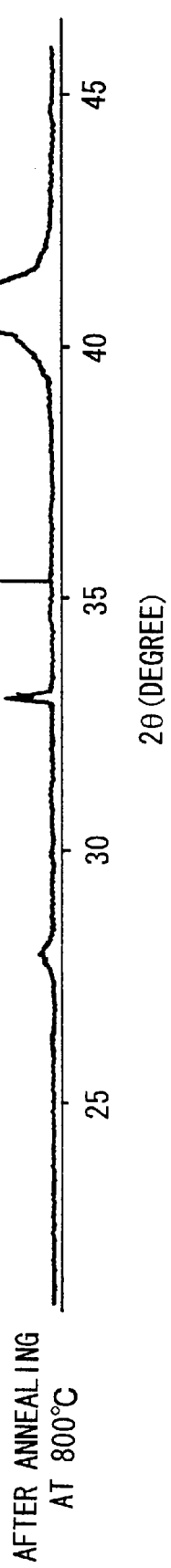

ELECTRONIC MATERIAL, ITS MANUFACTURING METHOD, DIELECTRIC CAPACITOR, NONVOLATILE MEMORY AND SEMICONDUCTOR DEVICE

BACKGROUND OF THE INVENTION

1. Field of the Invention

This invention relates to an electronic material, its manufacturing method, dielectric capacitor, nonvolatile memory and semiconductor device.

2. Description of the Related Art

Ferroelectric memory is nonvolatile memory utilizing high-speed inversion of polarization and residual polarization of a ferroelectric film and permitting high-speed rewriting. FIG. 13 shows an example of conventional ferroelectric memory.

As shown in FIG. 13, the conventional ferroelectric memory includes a field insulation film 102 selectively provided on one surface of a p-type Si substrate 10 to separate individual devices. A gate insulation film 103 is provided on the surface of an active region surrounded by the field insulation film 102. Reference symbol WL denotes a word line. An $n^+$-type source region 104 and a drain region 105 are provided in selective portions of the p-type Si substrate 101 at opposite sides of the word line WL. The word line WL, source region 104 and drain region 105 construct a transistor Q.

Numeral 106 denotes an inter-layer insulation film. Sequentially deposited on the inter-layer insulation film 106 above the field insulation film 102 via a Ti film 107 as a bonding layer with a thickness around 30 nm, for example, are: a Pt film 108 of a thickness around 200 nm, for example, to behave as a lower electrode, a ferroelectric film 109 made of a $Pb(Zr, Ti)O_3$ (PZT) film or $SrBi_2Ta_2O_9$ (SBT) film 109 with a thickness around 200 nm, for example, and a Pt film 110 as an upper electrode with a thickness around 200 nm, for example, which all construct a capacitor C. The transistor Q and the capacitor C form one memory cell.

Numeral 111 denotes an inter-layer insulation film. A contact hole 112 is provided in the inter-layer insulation films 106 and 111 above the source region 104. Another contact hole 113 is formed in the inter-layer insulation film 111 above one end of the Pt film 108. A further contact hole 114 is provided in the inter-layer insulation film 111 above the Pt film 110. The source region 104 of the transistor Q and the Pt film 108 forming the lower electrode of the capacitor C are connected by wiring 115 through the contact holes 112 and 113. Wiring 116 is connected to the Pt film 110 as the upper electrode of the capacitor C through the contact hole 114. Numeral 117 denotes a passivation film.

In the conventional ferroelectric memory shown in FIG. 13, the transistor Q and the capacitor C are arranged laterally side-by-side (in the direction parallel to the substrate surface). However, a structure with a longitudinal (normal to the substrate surface) arrangement of the transistor Q and the capacitor C is required to increase the information recording density of the ferroelectric memory. An example designed for this purpose is shown in FIG. 14 where elements common to FIG. 13 are labelled with the same reference numerals.

In FIG. 14, WL1 through WL4 are word lines, and 118 is an inter-layer insulation film. A contact hole 119 is provided in the inter-layer insulation film 118 above the drain region 105 to connect the bit line BL to the drain region 105 of the transistor Q through the contact hole 119. Numerals 120 and 121 denote inter-layer insulation films. A contact hole 122 is provided in the inter-layer insulation film 121 above the source region 104, and a polycrystalline Si plug 123 is inlaid into the contact hole 122. The source region 104 of the transistor Q and the Pt film 108 as the lower electrode of the capacitor C are electrically connected by the polycrystalline Si plug 123.

Upon forming the ferroelectric film 109, it is usually necessary to anneal the product in an oxygen atmosphere at a temperature as high as 600 through 800° C. for crystallization. During the process, however, Si of the polycrystalline Si plug 123 thermally diffuses into the Pt film 108 forming the lower electrode of the capacitor C, and is oxidized in an upper layer of the Pt film 108. Thus, the Pt film 108 results in losing its electric conductivity. Moreover, Si further diffuses into the ferroelectric film 109, and seriously deteriorates the characteristics of the capacitor C.

It has been reported that, if the ferroelectric film 109 is made of PZT whose burning temperature is around 600° C., a nitride film, such as TiN, can be used as a film for preventing diffusion of Si (Japan Society of Applied Physics spiring1995, 30p-D-20, 30p-D-10). Nitride films, however, are oxidized when annealed in high-temperature oxide atmospheres, and lose electric conductivity. Therefore, when introducing a sufficient amount of oxygen into the annealing atmosphere and increasing the annealing temperature to improve the ferroelectric characteristics of the ferroelectric film 109, such oxidization causes a surface roughness and an increase in electric resistance.

On the other hand, when the ferroelectric film 109 is made of SBT, which is believed to have better fatigue characteristics than PZT, it needs an annealing temperature around 800° C. higher than that of the PZT for ensuring acceptable ferroelectric characteristics. Therefore, if SBT is used as the material of the ferroelectric material 109, the diffusion preventing layer made of the above-mentioned nitride film is not resistant to the high temperature, and is not usable.

There is not report, heretofore, on a deposited capacitor structure using SBT as the material of the ferroelectric thin film 109, and it has been considered difficult to realize high-integrated nonvolatile memory using such a capacitor.

The same problems may arise also when a W plug is used in lieu of the polycrystalline Si plug.

On the other hand, there is a conventional example of very high integrated semiconductor circuit device, as shown in FIG. 15, having a multi-layered wiring structure in which minimum processing size is 0.50 to 0.35 $\mu$m (for example, Nikkei Microdevice, July 1994, pp. 50–57, and Nikkei Microdevice, September 1995, pp. 70–77).

As shown in FIG. 15, in the conventional semiconductor integrated circuit device, a p well 202 and an n well 203 are provided in an n-type Si substrate 201. The n-type Si substrate 201 has a recess 204 on its surface of a portion thereof used as the device isolating region, and a field insulation film 205 made of $SiO_2$ is inlaid into the recess 204. A gate insulation film 206 made of $SiO_2$ is provided on the surface of the active region surrounded by the field insulation film 205. Numeral 207 denotes a polycrystalline Si film doped with an impurity, and 208 denotes a metal silicide film such as $WSi_x$ film. The polycrystalline Si film 207 and the metal silicide film 208 form a polycide-structure gate electrode. A side wall spacer 209 made of $SiO_2$ is provided on side walls of the polycrystalline Si film 207 and the metal silicide film 208. Provided in the n well 203 are $p^+$-type diffused layers 210, 211 for use as a source region or a drain region in self alignment with the gate electrode made of the polycrystalline Si film 207 and the metal silicide film 208. The gate electrode and the diffused layers 210, 211 form a p-channel MOS transistor. Similarly, an n-channel MOS transistor is formed in the p well 202. Numerals 212 and 213 denote $n^+$-type diffused layers used as the source region or the drain region of the n-channel MOS transistor.

An inter-layer insulation film 214 is provided to cover the p-channel MOS transistor and the n-channel MOS transistor. The inter-layer insulation film 214 has connection holes 215, 216 at portions aligned with the diffused layer 211 of the p-channel MOS transistor and the gate electrode of the field insulation film 205, respectively. A W plug 219 is inlaid in these connection holes 215, 216 via a Ti film 217 and a TiN film 218.

Provided on the connection hole 215, 216 is an Al-Cu alloy wiring 222 via a Ti film 220 and a TiN film 221, and provided thereon is a TiN film 223. Numeral 224 denotes an inter-layer insulation film. The inter-layer insulation film 224 has connection holes 225, 226 at portions aligned with the Al-Cu alloy wiring 222. A W plug 229 is inlaid in these connection holes 225, 226 via a Ti film 227 and a TiN film 228.

Further provided on the connection holes 225 and 226 is an Al-Cu alloy wiring 232 via a Ti film 230 and a TiN film 231, and provided thereon is a TiN film 233.

In the semiconductor integrated circuit device shown in FIG. 15, the TiN film 217 on the diffused layer 211 (having a thickness, typically, 5 to 50 nm) at a portion of the connection hole 215 is used mainly for ensuring good electric connection between the W plug 219 and the diffused layer 211 and for improving adhesion to the underlying material, taking it into account that, since the surface of the diffused layer 211 is chemically active, a $SiO_x$ film as thin as 0.5 to 5 nm is formed on the surface in a very short time (probably less than 2 to 3 minutes) when exposed to moisture or air, and electric connection and adhesion to the diffused layer 211 and degraded. In contrast, when the Ti film 217 is provided on the diffused layer 211, chemical reaction occurs between the Ti film 217 and the $SiO_x$ film formed on the surface of the diffused layer 211, and improves the electric connection and mechanical adhesion.

However, when the W plug 219 (typically as thick as 50 to 700 nm) is formed on the diffused layer 211 via the Ti film 217, $WSi_x$ is formed by chemical reaction of Si in the diffused layer 211 and the W plug 219 during annealing for forming the W plug 219 (typically at 300 to 300° C.) or during subsequent annealing (typically at 350 to 450° C.). Then, due to movements of elements (mainly, Si moves from the diffused layer 211 into the W plug 219), gaps are produced between the diffused layer 211 and the W plug 219, and degrade electrical connection. Thus, in order to prevent chemical reaction between the diffused layer 2111 and the W plug 219, the TiN film 218 (typically 5 to 50 nm thick) is provided between the Ti film 217 and the W plug 219. Therefore, the TiN film 218 is called barrier metal. Also usable a TiON film as the barrier metal.

The TiN film 220 formed on the W plug 219 is used to ensure reliable electrical connection and mechanical connection between the W plug 219 and the Al-Cu alloy wiring 222. The TiN film 221 on the Ti film 220 is used to minimize movements and chemical reaction of elements between the W plug 219 and the Al-Cu alloy wiring 222. Also the Ti film 230 and the TiN film 231 formed on the W plug 229 at connection holes 225, 226 are used for the same reason.

However, in the manufacturing process of the semiconductor integrated circuit device, if the W plug 219 is formed via the Ti film 217 and the TiN film 218, then the upper limit of the process temperature in subsequent steps is limited to a value not higher than the heat-resistant temperature of the TiN film 218. Since the heat resistant temperature of the TiN film 218 is around 500° C. (when using sputtering) through 650° C. (when using CVD), there is substantially no freedom for selecting the process temperature and time after the W plug 219 is formed. This problem arises also when a Si plug or Al plug is used instead of the W plug 219.

For these reasons, in the case where, like the conventional ferroelectric memory shown in FIG. 14, the transistor Q and the capacitor C are aligned longitudinally so as to connect the lower electrode of the capacitor C, namely the Pt film 108, to the source region 104 of the transistor Q via the polycrystalline Si plug 123 or W plug, it has been difficult to use SBT, requiring high-temperature annealing, as the material of the ferroelectric film 109 of the capacitor C.

OBJECTS AND SUMMARY OF THE INVENTION

It is therefore an object of the invention to provide an electronic device suitable for use as a material of a diffusion preventing layer, or a lower electrode, for preventing diffusion of Si or W from a plug into the lower electrode in a structure where a transistor and a dielectric capacitor are arranged longitudinally so to connect the lower electrode of the dielectric capacitor to a diffused layer of the transistor by the Si or W plug; a method for manufacturing the electronic material; a dielectric capacitor using such a diffusion preventing layer and permitting the use of PZT or SBT, requiring high-temperature annealing, as the material of the dielectric film thereof; and nonvolatile memory using the dielectric capacitor.

Another object of the invention is to provide a semiconductor device providing a larger freedom in selecting the process temperature or time in steps after a plug is formed in a process making the semiconductor device in a semiconductor integrated circuit device, or the like.

The Inventor made laborious studies to overcome the above-mentioned problems involved in the prior art technique, as summarized below.

In order to prevent diffusion of Si into a lower electrode made of Pt, for example, from a polycrystalline Si plug, it is effective to provide a diffusion preventing layer between the lower electrode and the polycrystalline Si plug. What is required for the diffusion preventing layer is to reliably prevent diffusion of Si and to maintain electric conductivity of the lower electrode even after annealing in an oxidic atmosphere at a temperature as high as 800° C. for crystallization of the ferroelectric film.

A film made of only a noble metal, such as Pt, Ir or Ru, in general, cannot prevent diffusion of Si. If a conductive noble metal oxide, such as $IrO_2$ or $RuO_2$, is used, electric conductivity is lost due to oxidization of the polycrystalline Si plug by oxygen diffused from $IrO_2$ or $RuO_2$ into the polycrystalline Si plug during annealing. This occurs because Si has a stronger coupling force with oxygen than a noble metal. Conductive nitrides, such as TiN and TaN, involve the problem of heat resistivity and anti-oxidization as mentioned above.

In view of these facts, the Inventor has found that diffusion of Si from the polycrystalline Si plug into the lower electrode can be prevented without degrading electrical conduction between the polycrystalline Si plug and the lower electrode by introducing a small amount of a transition metal and oxygen into a noble metal, such as Pt or Ir, to form a transition metal oxide contained noble metal film and use it as the diffusion preventing layer between lower electrode and the polycrystalline Si plug. Since the introduced oxygen suppresses spontaneous diffusion of the noble metal, the transition metal oxide contained noble metal film prevents diffusion of Si therethrough. Additionally, since the transition metal having an intensive coupling force with oxygen is introduced, diffusion of oxygen into the polycrystalline Si plug and oxidization of the polycrystalline Si plug thereby are prevented. Further, since the major content of the transition metal oxide contained noble metal film is a noble metal, reliable electrical conductivity is ensured.

The Inventor has also found that the lower electrode is practically acceptable even when it is made of the transition metal oxide contained noble metal film alone without using Pt or other noble metal.

The transition metal oxide contained noble metal film can be readily made by introducing into a noble metal a transition metal having an intensive coupling force with hydrogen and by stacking it by sputtering while introducing oxygen ($O_2$) or water vapor ($H_2O$). Alternatively, it can be deposited by sputtering, putting a transition metal chip on a noble metal target.

An $Ir_{80}Hf_4O_{16}$ film (composition in atomic %) was actually prepared as an example of the transition metal oxide contained noble metal film, and a result of X-ray diffraction thereof is shown in FIGS. 1A and 1B. FIG. 1A shows data immediately after it is deposited and FIG. 1B shows data after it is annealed at 800° C.

With reference to FIG. 1A, the film is made of fine crystals with crystal grain sizes as small as 10 nm or less immediately after deposited, and substantially no iridium oxide is found. With reference to FIG. 1B, although the crystal grain size is slightly larger, the film still maintains a fine crystal state with a crystal grain size around 15 nm. This demonstrates that the $Ir_{80}Hf_4O_{16}$ film is thermally stable. Substantially no peak by $IrO_2$ or other iridium oxide is found.

Japanese Patent Laid-Open Publication No. Hei 7-245237 discloses the use of iridium oxide as the material of the lower electrode of the dielectric capacitor. However, the $Ir_{80}Hf_4O_{16}$ film, although containing Ir and O, additionally includes Hf, and exhibits a crystal structure of metal iridium, and not an iridium oxide such as $IrO_2$. That is, the $Ir_{80}Hf_4O_{16}$ film is a material largely different from that taught by the above-mentioned publication.

Moreover, the Inventor has found that compositions of a noble metal, transition metal and oxygen in the transition metal oxide contained noble metal film are desired to be within the range shown by the hatching in FIG. 2. If the noble metal is much beyond the range, a stable fine crystal state is not obtained. If it is too small, the electric resistance increases, and the crystalline state becomes unstable. Additionally, maintaining compositions of the transition metal and oxygen within the range shown here results in stabling the fine crystal state.

In order to obtain the fine crystal state, reactive sputtering as a stacking method using a high energy is preferably used to stack the transition metal oxide contained noble metal film. In this process, $O_2$ or $H_2O$ must be mixed into the sputtering gas in order to supply oxygen. Alternatively, by putting a transition metal chip, such as Hf, on a noble metal target, it may be deposited by sputtering in an atmosphere of $O_2$ gas or $H_2$ gas.

On the other hand, as a result of laborious studies, the Inventor has found that diffusion of Si from the polycrystalline Si plug into the lower electrode can be prevented while maintaining electric conduction between the polycrystalline Si plug and the lower electrode, by introducing a small amount of a rare earth element and oxygen into a noble metal, such as Pt or Ir, to form a rare earth oxide contained noble metal film and to use it as the diffusion preventing layer between lower electrode and the polycrystalline Si plug. Since the introduced oxygen suppresses spontaneous diffusion of the noble metal, the rare earth oxide contained noble metal film prevents diffusion of Si therethrough. Additionally, since the rare earth element having an intensive coupling force with oxygen is introduced, diffusion of oxygen into the polycrystalline Si plug and oxidization of the polycrystalline Si plug thereby are prevented. Further, since the major content of the rare earth oxide contained noble metal film is a noble metal, reliable electrical conductivity is ensured.

The Inventor has also found that the lower electrode is practically acceptable even when it is made of the rare earth oxide contained noble metal film alone without using Pt or other noble metal.

The rare earth oxide contained noble metal film can be readily made by introducing into a noble metal a rare earth element having an intensive coupling force with hydrogen and by stacking it by sputtering while introducing oxygen ($O_2$) or water vapor ($H_2O$). Alternatively, it can be deposited by sputtering, putting a rare earth oxide chip on a noble metal target.

An $Ir_{80}Y_5O_{15}$ film (composition in atomic %) was actually prepared as an example of the rare earth oxide contained noble metal film, and a result of X-ray diffraction thereof is shown in FIGS. 3A and 3B. FIG. 3A shows data immediately after it is deposited and FIG. 3B shows data after it is annealed at 800° C.

With reference to FIG. 3A, the film is made of fine crystals with crystal grain sizes as small as 10 nm or less immediately after deposited, and substantially no iridium oxide is found. With reference to FIG. 3B, although the crystal grain size is slightly larger, the film still maintains a fine crystal state with a crystal grain size around 17 nm. This demonstrates that the $Ir_{80}Y_5O_{15}$ film is thermally stable. Substantially no peak by $IrO_2$ or other iridium oxide is found.

Japanese Patent Laid-Open Publication No. Hei 7-245237 discloses the use of iridium oxide as the material of the lower electrode of the dielectric capacitor. However, the $Ir_{80}Y_5O_{15}$ film, although containing Ir and O, additionally includes Hf, and exhibits a crystal structure of metal iridium, and not an iridium oxide such as $IrO_2$. That is, the $Ir_{80}Y_5O_{15}$ film is a material largely different from that taught by the above-mentioned publication.

Moreover, the Inventor has found that compositions of a noble metal, rare earth element and oxygen in the rare earth oxide contained noble metal film are desired to be within the range shown by the hatching in FIG. 4. If the noble metal is too much beyond the range, a stable fine crystal state is not obtained. If it is too small, the electric resistance increases, and the crystalline state becomes unstable. Additionally, maintaining compositions of the rare earth element and oxygen within the range shown here results in stabling the fine crystal state.

In order to obtain the fine crystal state, reactive sputtering as a stacking method using a high energy is preferably used to stack the rare earth oxide contained noble metal film. In this process, $O_2$ or $H_2O$ must be mixed into the sputtering gas in order to supply oxygen. Alternatively, by putting a ceramics chip of a rare earth oxide, such as $Y_2O_3$, on a noble metal target, it may be deposited by sputtering in an atmosphere of $O_2$ gas or $H_2$ gas.

The present invention has been made based on the above studies and knowledge.

According to a first aspect of the invention, there is provided an electronic material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100.

According to a second aspect of the invention, there is provided a method for manufacturing an electronic device expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100, characterized in:

stacking the electronic material by reactive sputtering using oxygen or water vapor.

According to a third aspect of the invention, there is provided a dielectric capacitor comprising:

a diffusion preventing layer made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a lower electrode on the diffusion preventing layer;

a dielectric film on the lower electrode; and an upper electrode on the dielectric film.

According to a fourth aspect of the invention, there is provided a dielectric capacitor comprising:

a lower electrode made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a dielectric film on the lower electrode; and an upper electrode on the dielectric film.

According to a fifth aspect of the invention, there is provided a nonvolatile memory having a memory cell composed of a transistor and a dielectric capacitor, wherein the dielectric capacitor comprises:

a diffusion preventing layer made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a lower electrode on the diffusion preventing layer;

a dielectric film on the lower electrode; and an upper electrode on the dielectric film.

According to a sixth aspect of the invention, there is provided a nonvolatile memory having a memory cell composed of a transistor and a dielectric capacitor, wherein the dielectric capacitor comprises:

a lower electrode made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a dielectric film on the lower electrode; and an upper electrode on the dielectric film.

According to a seventh aspect of the invention, there is provided a semiconductor device comprising:

a first conductive layer;

a second conductive layer on the first conductive layer; and a diffusion preventing layer provided between the first conductive layer and the second conductive layer and made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100.

In the first to seventh aspects of the invention, the range of the composition of the material expressed by $M_{Ia}M_{IIb}O_c$ is substantially the same as the region shown by hatching in FIG. 2.

In the first to seventh aspects of the invention, the range of the composition of the material expressed by $M_{Ia}M_{IIb}O_c$ preferably satisfies $85 \geq a \geq 65$, $10 \geq b \geq 2$, $1 \leq c$ and a+b+c=100.

In the first to seventh aspects of the invention, the material expressed by $M_{Ia}M_{IIb}O_c$ may be, for example, Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O, Rh-W-O, or the like.

In the third and fifth aspects of the invention, the lower electrode is made of at least one sort of noble metal selected from the group consisting of Pt, Ir, Ru, Rh and Pd. More specifically, the lower electrode may be a film made of Pt, Ir, Ru, Rh or Pd, an alloy film of at least two sorts of noble metals selected from the group consisting of Pt, Ir, Ru, Rh and Pd, or a compound film of these noble metals.

In the first to seventh aspects of the invention, a Bi layer-structured perovskite-type ferroelectric material is typically used as the material of the dielectric film. Examples thereof are ferroelectric materials (with or without a slight amount of an oxide or compound oxide of Bi and Ta or Nb) containing 85% or more of a crystal layer expressed by the composition formula $Bi_x(Sr, Ca, Ba)_y(Ta, Nb)_2O_z$ (where $2.50 \geq x \geq 1.70$, $1.20 \geq y \geq 0.60$, $z=9 \pm d$ and $1.0 \geq d \geq 0$) or ferroelectric materials (with or without a slight amount of an oxide or compound oxide of Bi and Ta or Nb) containing 85% or more of a crystal layer expressed by the composition formula $Bi_xSr_yTa_2O_z$ (where $2.50 \geq x \geq 1.70$, $1.20 \geq y \geq 0.60$, $z=9 \pm d$ and $1.0 \geq d \geq 0$). A representative example of the latter is $SrBi_2Ta_2O_9$. Also usable as the material of the dielectric film is a ferroelectric material expressed by $Pb(Zr, Ti)O_3$. These ferroelectric materials are suitable for use as materials of ferroelectric films in ferroelectric memory. Also usable as the material of the dielectric film is, for example, a high dielectric material expressed by (Ba, Sr)TiO$_3$. This is suitable for use as the material of the dielectric film of a capacitor in DRAM, for example.

In the nonvolatile memory according to the fifth or sixth aspect of the invention, when the transistor and the dielectric capacitor are longitudinally aligned for higher integration, the diffusion preventing layer and the lower electrode are typically provided on a Si or W plug formed on the diffused layer of the transistor. In this case, for the purpose of reducing the contact resistance between the plug and the diffusion preventing layer or the lower electrode, a bonding layer made of Ti, Ta, Hf or Zr is preferably provided between the plug and the diffusion preventing layer or the lower electrode. In the nonvolatile memory according to the fifth aspect of the invention, the bonding layer may be provided between the diffusion preventing layer and the lower electrode. When a Bi layer-structured perovskite-type ferroelectric material, such as SBT, is used as the material of the first ferroelectric film, it is known that diffusion of Bi occurs during annealing for crystallization. However, in the nonvolatile memory according to the fifth aspect of the invention, which uses the bonding layer made of Ti, Ta, Hf or Zr formed between the diffusion preventing layer and the lower electrode, the bonding layer behaves as a trap of Bi diffusion, and results in improving the smoothness of the surface of the ferroelectric film.

According to an eighth aspect of the invention, there is provided a dielectric capacitor comprising:

a diffusion preventing layer made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100;

a lower electrode on the diffusion preventing layer;

a dielectric film on the lower electrode; and an upper electrode on the dielectric film.

According to a ninth aspect of the invention, there is provided a dielectric capacitor comprising:

a lower electrode made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100;

a dielectric film on the lower electrode; and an upper electrode on the dielectric film.

According to a tenth aspect of the invention, there is provided a nonvolatile memory having a memory cell composed of a transistor and a dielectric capacitor, wherein the dielectric capacitor comprises:

a diffusion preventing layer made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100;

a lower electrode on the diffusion preventing layer;

a dielectric film on the lower electrode; and an upper electrode on the dielectric film.

According to an eleventh aspect of the invention, there is provided a nonvolatile memory having a memory cell composed of a transistor and a dielectric capacitor, wherein the dielectric capacitor comprises:

a lower electrode made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100;

a dielectric film on the lower electrode; and an upper electrode on the dielectric film.

According to a twelfth aspect of the invention, there is provided a semiconductor device comprising:

a first conductive layer;

a second conductive layer on the first conductive layer; and a diffusion preventing layer provided between the first conductive layer and the second conductive layer and made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and a+b+c=100.

In the eighth to twelfth aspects of the invention, the range of the composition of the material expressed by $M_{Ia}M_{IIb}O_c$ is substantially the same as the region shown by hatching in FIG. 4.

In the eighth to twelfth aspects of the invention, the range of the composition of the material expressed by $M_{Ia}M_{IIb}O_c$ preferably satisfies $85 \geq a \geq 65$, $10 \geq b \geq 2$, $1 \leq c$ and a+b+c=100.

In the eighth to twelfth aspects of the invention, the material of the diffusion preventing layer or the lower electrode expressed by $M_{Ia}M_{IIb}O_c$ may be, for example, Ir-Y-O, Ir-Ce-O, Ir-Dy-O, Ir-Gd-O, Ru-Y-O, Pt-Y-O, Pd-Y-O, Rh-Y-O, or the like. The diffusion preventing layer or the lower electrode made of the material expressed by $M_{Ia}M_{IIb}O_c$ is preferably deposited by reactive sputtering using oxygen or water vapor.

In the eighth and tenth aspects of the invention, the lower electrode is made of at least one sort of noble metal selected from the group consisting of Pt, Ir, Ru, Rh and Pd. More specifically, the lower electrode may be a film made of Pt, Ir, Ru, Rh or Pd, an alloy film of at least two sorts of noble metals selected from the group consisting of Pt, Ir, Ru, Rh and Pd, or a compound film of these noble metals.

In the eighth to twelfth aspects of the invention, a Bi layer-structured perovskite-type ferroelectric material is typically used as the material of the dielectric film. Examples thereof are ferroelectric materials (with or without a slight amount of an oxide or compound oxide of Bi and Ta or Nb) containing 85% or more of a crystal layer expressed by the composition formula $Bi_x$ (Sr, Ca, Ba)$_y$(Ta, Nb)$_2O_z$ (where $2.50 \geq x \geq 1.70$, $1.20 \geq y \geq 0.60$, z=9±d and $1.0 \geq d \geq 0$) or ferroelectric materials (with or without a slight amount of an oxide or compound oxide of Bi and Ta or Nb) containing 85% or more of a crystal layer expressed by the composition formula $Bi_xSr_yTa_2O_z$ (where $2.50 \geq x \geq 1.70$, $1.20 \geq y \geq 0.60$, z=9±d and $1.0 \geq d \geq 0$). A representative example of the latter is $SrBi_2Ta_2O_9$. Also usable as the material of the dielectric film is a ferroelectric material expressed by Pb(Zr, Ti)O$_3$. These ferroelectric materials are suitable for use as materials of ferroelectric films in ferroelectric memory. Also usable as the material of the dielectric film is, for example, a high dielectric material expressed by $(Ba, Sr)TiO_3$. This is suitable for use as the material of the dielectric film of a capacitor in DRAM, for example.

In the nonvolatile memory according to the tenth or eleventh aspect of the invention, when the transistor and the dielectric capacitor are longitudinally aligned for higher integration, the diffusion preventing layer and the lower electrode are typically provided on a Si or W plug formed on the diffused layer of the transistor. In this case, for the purpose of reducing the contact resistance between the plug and the diffusion preventing layer or the lower electrode, a bonding layer made of Ti or Ta is preferably provided between the plug and the diffusion preventing layer or the lower electrode. In the tenth aspect of the invention, the bonding layer may be provided between the diffusion preventing layer and the lower electrode. When a Bi layer-structured perovskite-type ferroelectric material, such as SBT, is used as the material of the ferroelectric film, it is known that diffusion of Bi occurs during annealing for crystallization. However, in the nonvolatile memory according to the tenth aspect of the invention, which uses the bonding layer made of Ti or Ta formed between the diffusion preventing layer and the lower electrode, the bonding layer behaves as a trap of Bi diffusion, and results in improving the smoothness of the surface of the ferroelectric film.

According to the first aspect of the invention having the features summarized above, an electronic material can be realized, which is suitable for use as the material of a diffusion preventing layer of a dielectric capacitor, as the material of a lower electrode of a dielectric capacitor or as the material of a diffusion preventing layer of a semiconductor device.

According to the second aspect of the invention having the features summarized above, an electronic material with a high quality can be manufactured easily, which is suitable for use as the material of a diffusion preventing layer of a dielectric capacitor, lower electrode of a dielectric capacitor or a diffusion preventing layer of a semiconductor device.

According to the third or fifth aspect of the invention having the features summarized above, since the dielectric capacitor includes the diffusion preventing layer made under the lower electrode from a material expressed by the composition formula $M_{Ia}M_{IIb}O_c$ having a composition in the range of $90 \geq a \geq 40$, $15 \geq b \geq 2$, $4 \leq c$ and $a+b+c=100$, and having a heat resistivity and an anti-oxidization property, even when the product is annealed at a high temperature in an oxygen atmosphere for crystallization of the dielectric film in a structure longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and it is prevented that the lower electrode loses its electric conductivity due to oxidization of Si or W diffused to an upper-lying layer of the lower electrode and that Si or W reaches the dielectric film and deteriorates the capacitor characteristics. Therefore, not only PZT but also SBT, which needs high-temperature annealing in an oxygen atmosphere for crystallization, can be used as the material of the dielectric film.

According to the fourth or sixth aspect of the invention having the features summarized above, since the lower electrode of the dielectric capacitor is made of a material expressed by the composition formula $M_{Ia}M_{IIb}O_c$ having a composition in the range of $90 \geq a \geq 40$, $15 \geq b \geq 2$, $4 \leq c$ and $a+b+c=100$, and having a heat resistivity and an anti-oxidization property, even when the product is annealed at a high temperature in an oxygen atmosphere for crystallization of the dielectric film in a structure longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and it is prevented that the lower electrode loses its electric conductivity due to oxidization of Si or W diffused to an upper-lying layer of the lower electrode and that Si or W reaches the dielectric film and deteriorates the capacitor characteristics. Therefore, not only PZT but also SBT, which needs high-temperature annealing in an oxygen atmosphere for crystallization, can be used as the material of the dielectric film.

According to the seventh aspect of the invention having the features summarized above, since the dielectric capacitor includes the diffusion preventing layer made between the first conductive layer and the second conductive layer from a material expressed by the composition formula $M_{Ia}M_{IIb}O_c$ having a composition in the range of $90 \geq a \geq 40$, $15 \geq b \geq 2$, $4 \leq c$ and $a+b+c=100$, and having a heat resistivity and an anti-oxidization property, diffusion of Si, or the like, can be prevented even when a high temperature is applied.

According to the eighth and tenth aspects of the invention having the features summarized above, since the dielectric capacitor includes the diffusion preventing layer made under the lower electrode thereof from a material expressed by the composition formula $M_{Ia}M_{IIb}O_c$ having a composition in the range of $90 \geq a \geq 40$, $15 \geq b \geq 2$, $4 \leq c$ and $a+b+c=100$, and having a sufficient heat resistivity and a sufficient anti-oxidization property, even when the product is annealed at a high temperature in an oxygen atmosphere for crystallization of the dielectric film in a structure longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and it is prevented that the lower electrode loses its electric conductivity due to oxidization of Si or W diffused to an upper-lying layer of the lower electrode and that Si or W reaches the dielectric film and deteriorates the capacitor characteristics. Therefore, not only PZT but also SBT, which needs high-temperature annealing in an oxygen atmosphere for crystallization, can be used as the material of the dielectric film.

According to the ninth and eleventh aspects of the invention having the features summarized above, since the lower electrode of the dielectric capacitor is made of a material expressed by the composition formula $M_{Ia}M_{IIb}O_c$ having a composition in the range of $90 \geq a \geq 40$, $15b \geq b \geq 2$, $4 \leq c$ and $a+b+c=100$, and having a sufficient heat resistivity and a sufficient anti-oxidization property, even when the product is annealed at a high temperature in an oxygen atmosphere for crystallization of the dielectric film in a structure longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and it is prevented that the lower electrode loses its electric conductivity due to oxidization of Si or W diffused to an upper-lying layer of the lower electrode and that Si or W reaches the dielectric film and deteriorates the capacitor characteristics. Therefore, not only PZT but also SBT, which needs high-temperature annealing in an oxygen atmosphere for crystallization, can be used as the material of the dielectric film.

According to the twelfth aspect of the invention having the features summarized above, since the dielectric capacitor includes the diffusion preventing layer made under the lower electrode thereof from a material expressed by the composition formula $M_{IIa}M_{IIb}O_c$ having a composition in the range of $90 \geq a \geq 40$, $15 \geq b \geq 2$, $4 \leq c$ and $a+b+c=100$, and having a sufficient heat resistivity and a sufficient anti-oxidization property, diffusion of Si, or the like, can be prevented even when a high temperature is applied.

The above, and other, objects, features and advantage of the present invention will become readily apparent from the following detailed description thereof which is to be read in connection with the accompanying drawings.

BRIEF DESCRIPTION OF THE DRAWINGS

FIGS. 1A and 1B are schematic diagrams showing a result of X-ray diffraction of an $Ir_{80}Hf_4O_{16}$ film;

FIGS. 3A and 3B are schematic diagrams showing a result of X-ray diffraction of an $Ir_{80}Y_5O_{15}$ film;

DESCRIPTION OF THE PREFERRED EMBODIMENTS

Some embodiments of the invention are described below with reference to the drawings.

Figure 5:
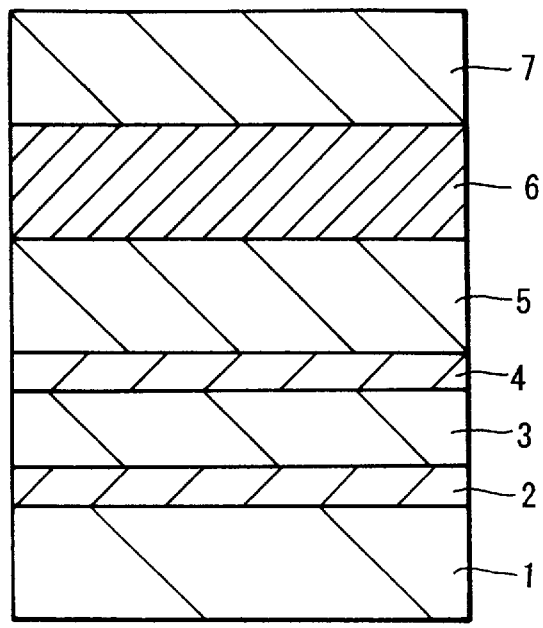
FIG. 5 is a cross-sectional view showing a dielectric capacitor according to the first embodiment of the invention.

FIG. 5 shows a dielectric capacitor according to the first embodiment of the invention.

As shown in FIG. 5, the dielectric capacitor according to the first embodiment includes a Ti film 2 as a bonding layer, Ir-Hf-O film 3 as a diffusion preventing layer, Ti film 4 as a bonding layer, Pt film 5 as the lower electrode, SBT film 6 forming a ferroelectric film and Pt film 7 as the upper electrode, which are deposited sequentially on a conductive Si substrate 1. Thicknesses of these films are, in an example, 25 nm of the Ti film 2, 100 nm of the Ir-Hf-O film 3, 20 nm of the Ti film 4, 200 nm of the Pt film 5, 200 nm of the SBT film 6, and 200 nm of the Pt film 7. The composition of the Ir-Hf-O film 3 is selected within the range shown by hatching in FIG. 2.

Explained below is a method for manufacturing the dielectric capacitor according to the first embodiment.

In order to manufacture the dielectric capacitor according to the first embodiment, the Si substrate 1 is first processed by rare hydrofluoric acid to remove the $SiO_2$ film (not shown) from its surface, and the Ti film 2 is deposited on the Si substrate 1 by sputtering.

Next deposited on the Ti film 2 is the Ir-Hr-O film 3 by reactive sputtering. Exemplary conditions for stacking the Ir-Hf-O film 3 are: using a DC bipolar magnetron sputtering apparatus, using as the target an Ir target with the size of 4 square inches and five Hf chip each being 5 mm×5 mm put on the Ir target, using as the sputtering gas a mix gas of Ar and $O_2$, setting their flow rates to 5.6 sccm and 0.7 sccm, the total pressure at 4 mTorr, supplied power being DC 0.4A, 420 V, and stacking rate being 100 nm per two minutes. The Ir-Hf-O film 3 was analytically confirmed by EPMA to have the composition $Ir_{80}Hf_4O_{16}$ (where compositions are in atomic %). After that, the Ti film 4 and the Pt film 5 are deposited sequentially on the Ir-Hr-O film 3 by sputtering.

Next deposited on the Pt film 5 is the SBT film 6 by sol-gel spin coating, for example. Then, after annealing the product in an oxygen atmosphere at 800° C. for one hour for crystallization of the SBT film 6, the PT film 7 is deposited by sputtering, for example. After that, the product is again annealed in an oxygen atmosphere at 800° C. for 10 minutes.

Figure 6:
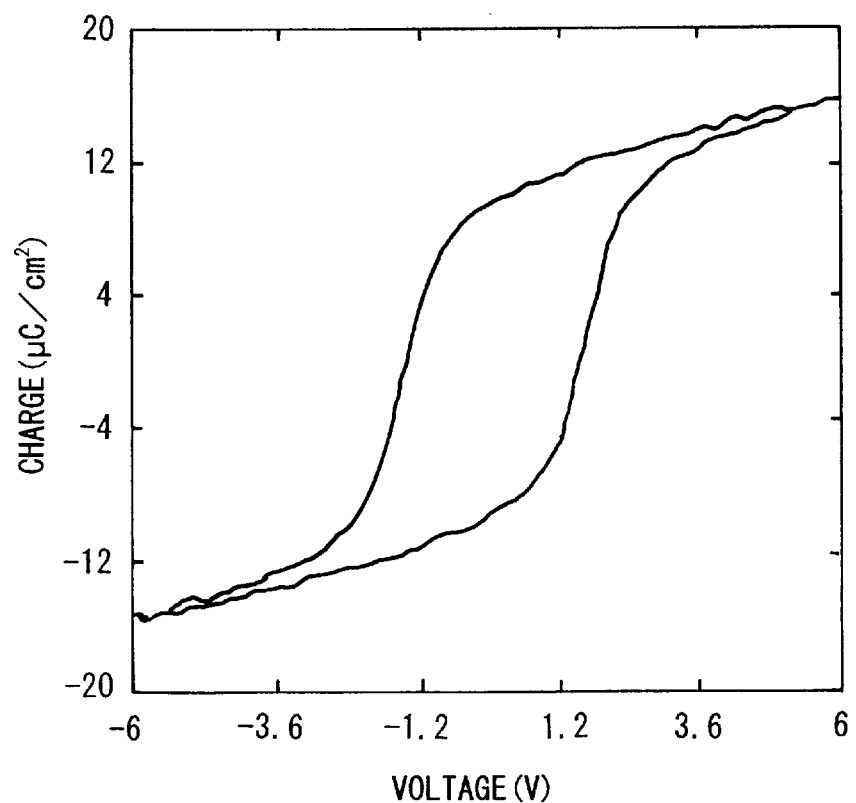
FIG. 6 is a schematic diagram showing a result of measurement of accumulated electric charge in the dielectric capacitor according to the first embodiment of the invention.

Using this dielectric capacitor, a voltage was applied between the Si substrate 1 and the Pt electrode 7, and electric charge accumulated therein was measured. FIG. 6 shows a result of the measurement in which the value of residual polarization, important in a ferroelectric memory, was $2P_r = 19$ $\mu C/cm^2$. This value of residual polarization is a good value for SBT, and it was obtained by measurement through the Si substrate 1. Additionally, the measured value of the electric resistance of the $Ir_{80}Hf_4O_{16}$ film 3 was 52 $\mu\Omega\cdot cm$. This value is amply acceptable for application to a ferroelectric memory using a dielectric capacitor.

For the purpose of comparison, another sample excluding the Ir-Hf-O film 3 in the structure of FIG. 5 was prepared, and electric charge was measured similarly. As shown in FIG. 6, the hysteresis curve was not good, and the sample was proved inoperative as a capacitor.

Table 1 shows residual polarization values $2P_r$ in structures different in material of the diffusion preventing layer containing $Ir_{80}Hf_4O_{16}$ and in material of the lower electrode made of a noble metal. Table 2 shows a result of measurement of comparative examples.

TABLE 1

| Embodiment | Diffusion Preventing Layer (in atomic %) | Lower Electrode | Residual Polarization 2P$_r$ ($\mu$C/cm$^2$) |
| --- | --- | --- | --- |
| 1 | Ir$_{80}$Hf$_4$O$_{16}$ | Pt | 19 |
| 2 | Ir$_{80}$Zr$_5$O$_{15}$ | Pt | 19 |
| 3 | Ir$_{75}$Nb$_8$O$_{17}$ | Pt | 19 |
| 4 | Ru$_{75}$Zr$_8$O$_{17}$ | Pt | 19 |
| 5 | Ru$_{74}$Ta$_8$O$_{18}$ | Pt | 19 |
| 6 | Pt$_{75}$Hf$_8$O$_{17}$ | Pt | 19 |
| 7 | Rt$_{75}$Zr$_8$O$_{17}$ | Pt | 19 |
| 8 | Pd$_{85}$Zr$_5$O$_{10}$ | Pt | 19 |
| 9 | Rh$_{85}$V$_5$O$_{10}$ | Pt | 19 |
| 10 | Rh$_{85}$Mo$_5$O$_{10}$ | Pt | 19 |
| 11 | Rh$_{85}$W$_4$O$_{16}$ | Pt | 19 |
| 12 | Ir$_{80}$Hf$_4$O$_{16}$ | Ir | 19 |
| 13 | Ir$_{80}$Hf$_4$O$_{16}$ | Ru | 17 |
| 14 | Ir$_{80}$Hf$_4$O$_{16}$ | Rh | 14 |
| 15 | Ir$_{80}$Hf$_4$O$_{16}$ | Pd | 18 |

TABLE 2

| Comparative Experiment | Diffusion Preventing Layer (in atomic %) | Lower Electrode | Residual Polarization 2P$_r$ ($\mu$C/cm$^2$) |
| --- | --- | --- | --- |
| 1 | None | Pt | 0 |
| 2 | TiN | Pt | unmeasurable due to bubbles generated |

Figure 2:
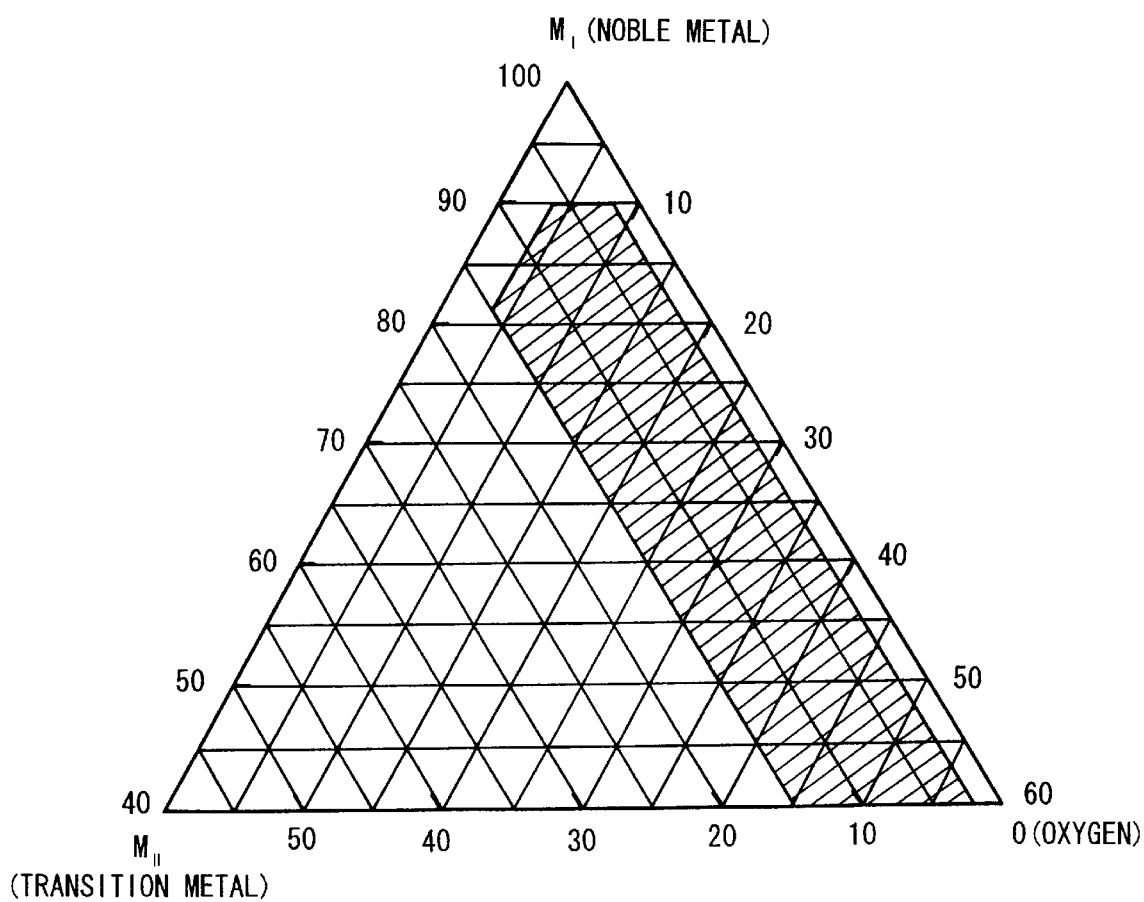
FIG. 2 is a schematic diagram showing the optimum range of composition in $M_{IIa}M_{IIb}O_c$ used as a material of a diffusion preventing layer or a lower electrode in first to seventh aspects of the invention.

As shown above, according to the first embodiment, since the Ir-Hf-O film 3 having a composition in the range shown by hatching in FIG. 2 is provided under the Pt film 5 as the lower electrode, even when the product is annealed at a temperature as high as 800° C. in an oxygen atmosphere for crystallization of the SBT film 6, thermal diffusion of Si from the Si substrate 1 into the Pt film 5 can be prevented, and it is therefore prevented that the lower electrode loses its electric conductivity due to oxidization of Si in an upper-lying layer of the lower electrode. Therefore, the dielectric capacitor can be used in a ferroelectric memory in which the transistor and the dielectric capacitor are aligned longitudinally so as to connect the lower electrode of the dielectric capacitor to the diffused layer of the transistor by a polycrystalline Si plug, and makes it possible to realize a high-integrated ferroelectric memory using a SBT film as its dielectric capacitor.

Figure 7:
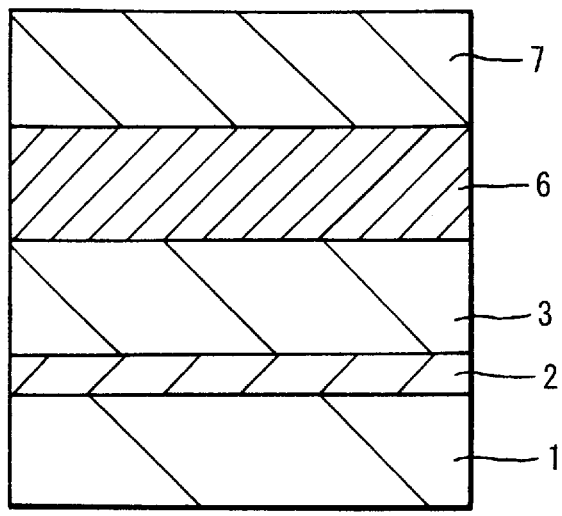
FIG. 7 is a cross-sectional view showing a dielectric capacitor according to the second embodiment of the invention.

FIG. 7 shows a dielectric capacitor according to the second embodiment of the invention.

By modifying the structure of FIG. 5 as shown in FIG. 7, namely, by directly using the Ir-Hf-O film 3 as the lower, and by using it as a dielectric capacitor, a high-integrated ferroelectric memory can be realized. In the dielectric capacitor, the Ti film 2 as the bonding layer, Ir-Hf-O film 3 as the lower electrode, SBT film 6 as the ferroelectric film, and Pt film 7 as the upper electrode are sequentially deposited on the conductive Si substrate 1.

Figure 8:
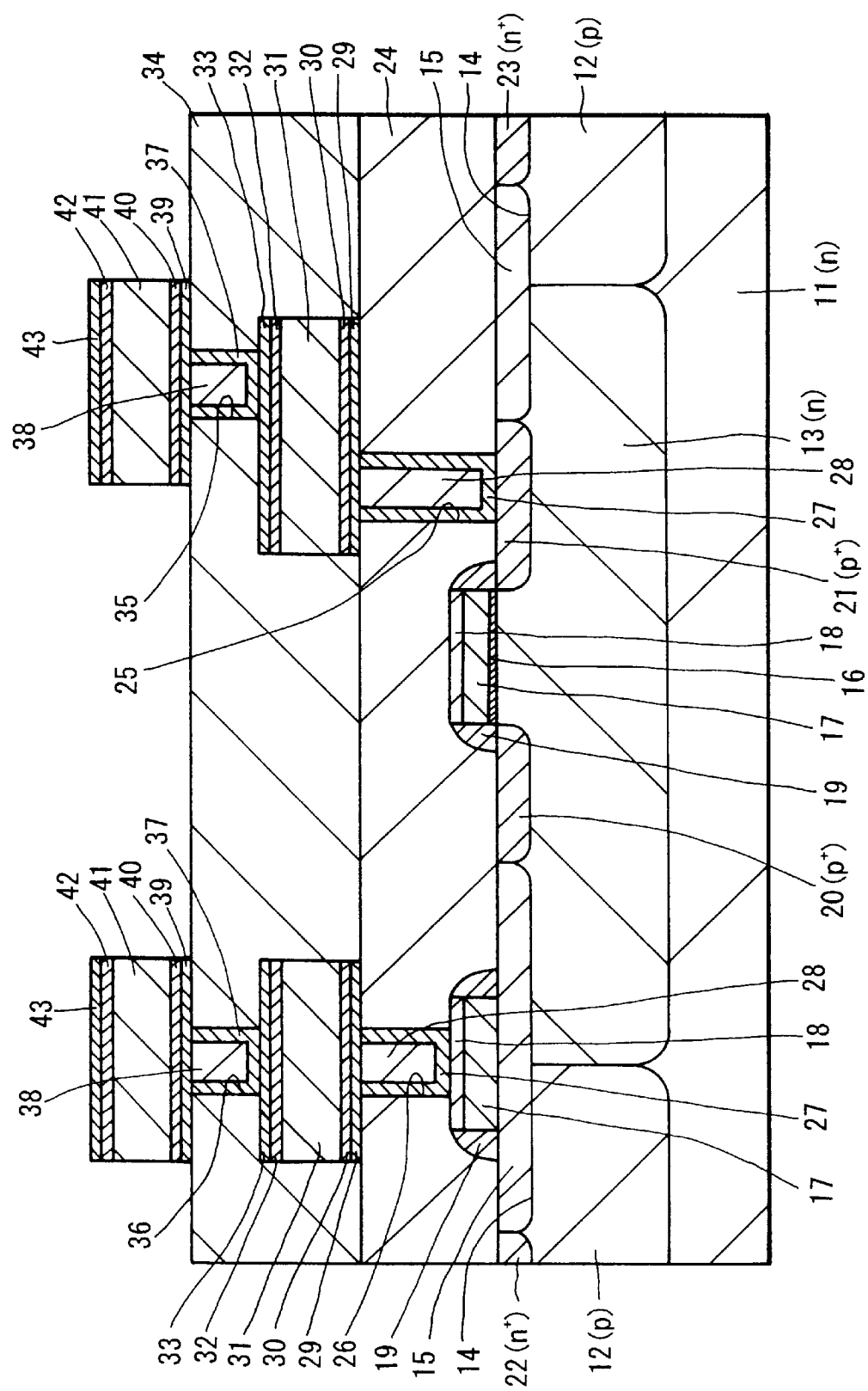
FIG. 8 is a cross-sectional view showing a semiconductor integrated circuit device according to the third embodiment of the invention.

FIG. 8 shows a semiconductor integrated circuit device having a multi-layered wiring structure according to the third embodiment of the invention.

As shown in FIG. 8, in the semiconductor integrated circuit device according to the third embodiment, p wells 12 and n wells 13 are provided in an n-type Si substrate 11. Recesses 14 are provided on the surface of the n-type Si substrate 11 in selective portions used as device isolating regions. A field insulation film 15 made of SiO$_2$ is inlaid in the recesses 14. A gate insulation film 16 made of SiO$_2$ is provided on the surface of active regions surrounded by the field insulation film 15. Numeral 17 denotes a polycrystalline Si film doped with an impurity, and 18 is a metal silicide film such as WSi$_x$ film. The polycrystalline Si film 17 and the metal silicide film 18 form a polycide-structured gate electrode. A side wall spacer 19 made of Sio$_2$ is provided on side walls of the polycrystalline Si film 17 and the metal silicide film 18. Formed in an n well 13 are p$^+$-type diffused layers 20, 21 in self alignment with the gate electrode composed of the polycrystalline Si film 17 and the metal silicide film 18 to be used as source regions and drain regions. A gate electrode and the diffused layers 20, 21 form a p-channel MOS transistor. Similarly formed in a p-well 12 is an n-channel MOS transistor. Numerals 22 and 23 denote n$^+$-type diffused layers used as source and drain regions of the n-channel MOS transistor.

An inter-layer insulation film 24 made of boro-phospho silicate glass (BPSG), for example, is provided to cover the p-channel MOS transistor and the n-channel MOS transistor. Connection holes 25 and 26 extend through the inter-layer insulation film 24 at a portion aligned with the diffused layer 21 of the p-channel MOS transistor and a portion aligned with the gate electrode on the field insulation film 15, respectively. A W plug 28 is inlaid in the connection holes 25, 26 via an Ir-Hf-O film 27.

An Al-Cu alloy wiring 31 is provided above the connection holes 25 and 26 via an Ir-Hf-O film 29 and a Ti film 30, and another Ti film 32 and another Ir-Hf-O film 33 are deposited sequentially on the wiring 31. Numeral 34 denotes an inter-layer insulation film made of BPSG, for example. Connection holes 35 and 36 extend through the inter-layer insulation film 34 at portions aligned with the Al-Cu alloy wiring 31. A W plug 38 is inlaid inside the connection holes 35, 36 via an Ir-Hf-O film 37.

Further provided above the connection holes 35, 36 is an Al-Cu alloy wiring 41 via an Ir-Hf-O film 39 and a Ti film 40, and another Ti film 42 and another Ir-Hf-O film 43 are deposited sequentially on the wiring 41.

Compositions of the Ir-Hf-O films 27, 29, 33, 37, 39 and 43 are selected within the range shown by hatching in FIG. 2. The Ti films 30, 32 are used to ensure reliable adhesion of the Ir-Hf-O films 29, 33 to the Al-Cu alloy wiring 31. Also the Ir-Hf-O films 39, 43 on and under the Al-Cu alloy wiring 41 are used for the same purpose.

As explained above, according to the third embodiment, since the W plug 28 is formed in the connection holes 25, 26 via the Ir-Hf-O film 27 having a sufficiently high heat resistivity, as compared with TiN and TiON films conventionally used as barrier metals, and therefore capable of preventing diffusion of Si, or the like, even under a high temperature, the Ir-Hf-O film 27 alleviates restriction on the process temperature in steps after deposition of the W plug 28 and permits the process temperature and time to be selected more freely in later steps. Moreover, since this embodiment interposes the Ir-Hf-O film 29 between the W plug 28 and the overlying Al-Cu alloy wiring 31, and the Ir-Hf-O film 33 between the Al-Cu alloy wiring 31 and the overlying W plug 38, the Ir-Hf-O films 29 and 33 prevent undesired diffusion between the W plugs 28, 38 and the Al-Cu alloy wiring 31. Similarly, the Ir-Hf-O film 39 interposed between the W plug 38 and the Al-Cu alloy wiring 41 prevents undesired diffusion between the W plug 38 and the Al-Cu alloy wiring 41.

The semiconductor integrated circuit device according to the third embodiment is suitable for use in MOSLSI, such as DRAM and MPU, and other various semiconductor integrated circuit devices.

Figure 9:
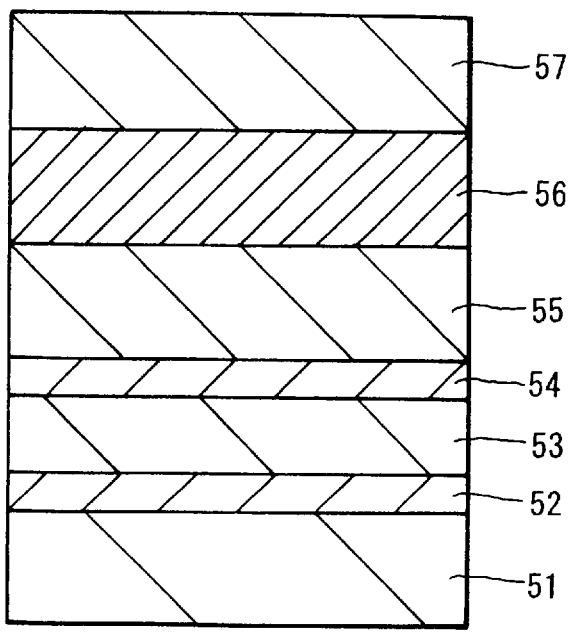
FIG. 9 is a cross-sectional view showing a dielectric capacitor according to the fourth embodiment of the invention.

FIG. 9 shows a dielectric capacitor according to the fourth embodiment of the invention.

As shown in FIG. 9, the dielectric capacitor according to the fourth embodiment includes a Ti film 52 as a bonding layer, Ir-Y-O film 53 as a diffusion preventing layer, Ti film 54 as a bonding layer, Pt film 55 as the lower electrode, SBT film 56 forming a ferroelectric film and Pt film 7 as the upper electrode, which are deposited sequentially on a conductive Si substrate 51. Thicknesses of these films are, in an example, 25 nm of the Ti film 52, 100 nm of the Ir-Y-O film 53, 20 nm of the Ti film 54, 200 nm of the Pt film 55, 200 nm of the SBT film 56, and 200 nm of the Pt film 57. The composition of the Ir-Y-O film 53 is selected within the range shown by hatching in FIG. 4.

Explained below is a method for manufacturing the dielectric capacitor according to the fourth embodiment.

In order to manufacture the dielectric capacitor according to the fourth embodiment, the Si substrate 51 is first processed by rare hydrofluoric acid to remove the $SiO_2$ film (not shown) from its surface, and the Ti film 52 is deposited on the Si substrate 51 by sputtering.

Next deposited on the Ti film 52 is the Ir-Y-O film 53 by reactive sputtering. Exemplary conditions for stacking the Ir-Y-O film 53 are: using a DC bipolar magnetron sputtering apparatus, using as the target an Ir target with the size of 4 square inches and five Y chip each being 5 mm×6 mm put on the Ir target, using as the sputtering gas a mix gas of Ar and $O_2$, setting their flow rates to 5.6 sccm and 0.7 sccm, the total pressure at 4 mTorr, supplied power being DC 0.4A, 450 V, and stacking rate being 100 nm per two minutes. The Ir-Y-O film 53 was analytically confirmed by EPMA to have the composition $Ir_{80}Y_5O_{15}$ (where compositions are in atomic %). After that, the Ti film 54 and the Pt film 55 are deposited sequentially on the Ir-Y-O film 53 by sputtering.

Next deposited on the Pt film 55 is the SBT film 56 by sol-gel spin coating, for example. Then, after annealing the product in an oxygen atmosphere at 800° C. for one hour for crystallization of the SBT film 56, the PT film 57 is deposited by sputtering, for example. After that, the product is again annealed in an oxygen atmosphere at 800° C. for 10 minutes.

Figure 10:
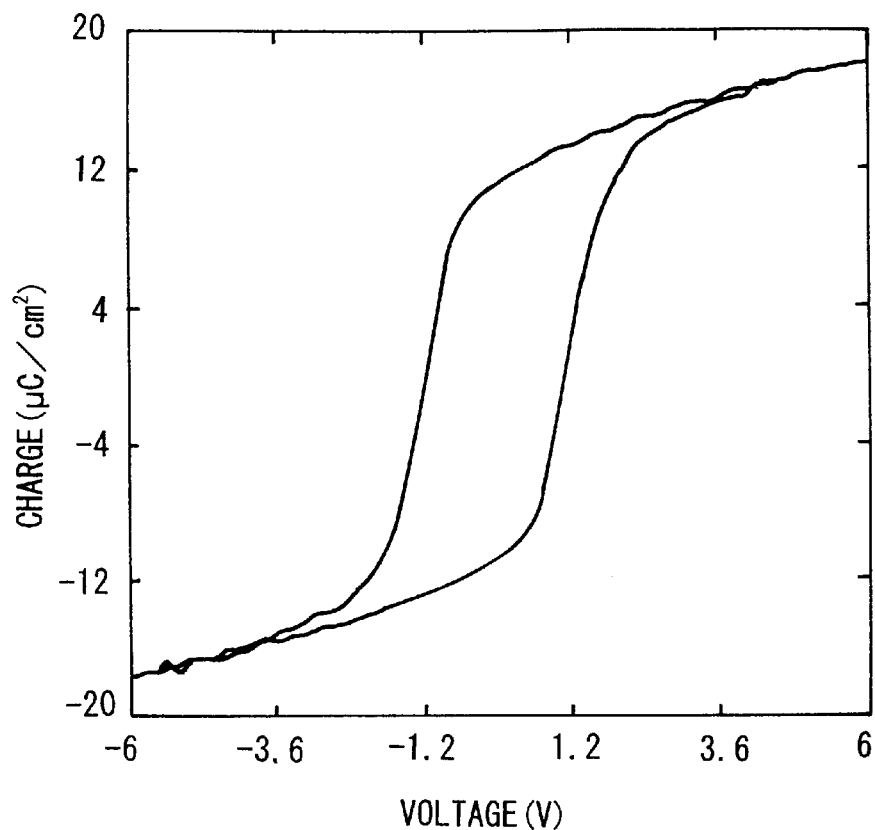
FIG. 10 is a schematic diagram showing a result of measurement of accumulated electric charge in the dielectric capacitor according to the fourth embodiment of the invention.

Using this dielectric capacitor, a voltage was applied between the Si substrate 51 and the Pt electrode 57, and electric charge accumulated therein was measured. FIG. 10 shows a result of the measurement in which the value of residual polarization, important in a ferroelectric memory, was $2P_r=19$ μC/cm$^2$. This value of residual polarization is a good value for SBT, and it was obtained by measurement through the Si substrate 51. Additionally, the measured value of the electric resistance of the $Ir_{80}Y_4O_{15}$ film 53 was 60 μΩ·cm. This value is amply acceptable for application to a ferroelectric memory using a dielectric capacitor.

For the purpose of comparison, another sample excluding the Ir-Y-O film 53 in the structure of FIG. 9 was prepared, and electric charge was measured similarly. As shown in FIG. 10, the hysteresis curve was not good, and the sample was proved inoperative as a capacitor.

Table 3 shows residual polarization values $2P_r$ in structures different in material of the diffusion preventing layer containing $Ir_{80}Y_5O_{15}$ and in material of the lower electrode made of a noble metal. Table 4 shows a result of measurement of comparative examples.

TABLE 3

| Embodiment | Diffusion Preventing Layer (in atomic %) | Lower Electrode | Residual Polarization $2P_r$ (μC/cm$^2$) |
| --- | --- | --- | --- |
| 1 | $Ir_{80}Y_5O_{15}$ | Pt | 19 |
| 2 | $Ir_{80}Dy_5O_{15}$ | Pt | 19 |
| 3 | $Ir_{90}Gd_5O_{15}$ | Pt | 19 |
| 4 | $Ru_{80}Y_5O_{15}$ | Pt | 19 |
| 5 | $Pt_{75}Y_8O_{17}$ | Pt | 19 |
| 6 | $Pd_{85}Y_5O_{10}$ | Pt | 19 |
| 7 | $Rh_{85}Y_5O_{10}$ | Pt | 19 |
| 8 | $Ir_{80}Y_5O_{15}$ | Ir | 19 |
| 9 | $Ir_{80}Y_5O_{15}$ | Ru | 17 |
| 10 | $Ir_{80}Y_5O_{15}$ | Rh | 14 |
| 11 | $Ir_{80}Y_5O_{15}$ | Pd | 18 |

TABLE 4

| Comparative Experiment | Diffusion Preventing Layer (in atomic %) | Lower Electrode | Residual Polarization $2P_r$ (μC/cm$^2$) |
| --- | --- | --- | --- |
| 1 | None | Pt | 0 |
| 2 | TiN | Pt | unmeasurable due to short circuit |

Figure 4:
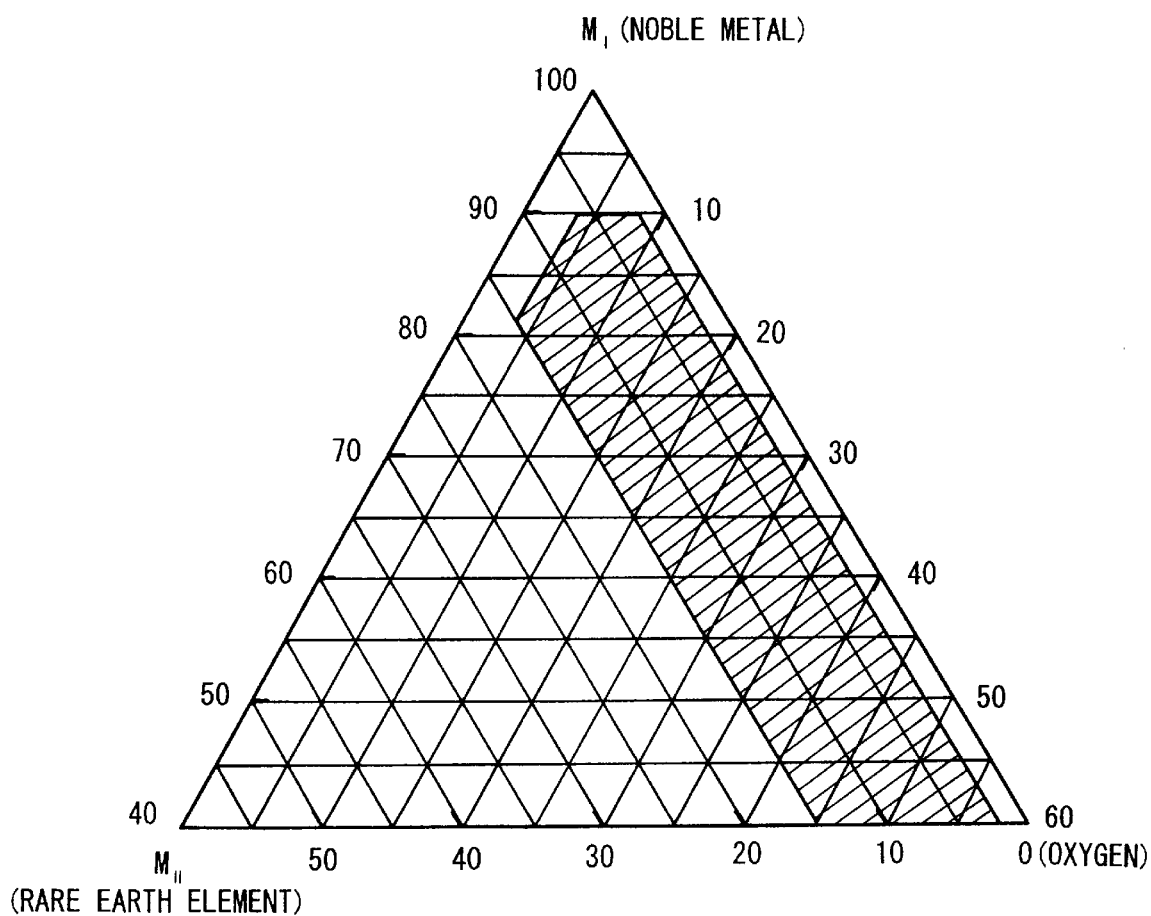
FIG. 4 is a schematic diagram showing the optimum range of composition in $M_{IIa}M_{IIb}O_c$ used as a material of a diffusion preventing layer or a lower electrode in eighth to twelfth aspects of the invention.

As shown above, according to the fourth embodiment, since the Ir-Y-O film 53 having a composition in the range shown by hatching in FIG. 4 is provided under the Pt film 55 as the lower electrode, even when the product is annealed at a temperature as high as 800° C. in an oxygen atmosphere for crystallization of the SBT film 56, thermal diffusion of Si from the Si substrate 51 into the Pt film 55 can be prevented, and it is therefore prevented that the lower electrode loses its electric conductivity due to oxidization of Si in an upper-lying layer of the lower electrode. Therefore, the dielectric capacitor can be used in a ferroelectric memory in which the transistor and the dielectric capacitor are aligned longitudinally so as to connect the lower electrode of the dielectric capacitor to the diffused layer of the transistor by a poly-crystalline Si plug, and makes it possible to realize a high-integrated ferroelectric memory using a SBT film as its dielectric capacitor.

Figure 11:
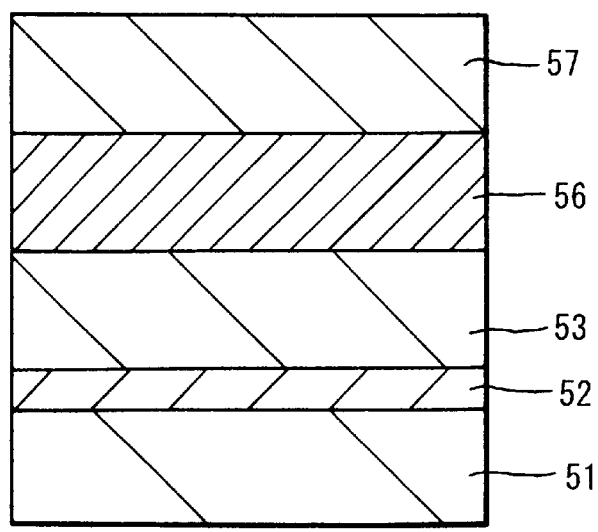
FIG. 11 is a cross-sectional view showing a dielectric capacitor according to the fifth embodiment of the invention.

FIG. 11 shows a dielectric capacitor according to the fifth embodiment of the invention.

By modifying the structure of FIG. 9 as shown in FIG. 11, namely, by directly using the Ir-Y-O film 53 as the lower, and by using it as a dielectric capacitor, a high-integrated ferroelectric memory can be realized. In the dielectric capacitor, the Ti film 52 as the bonding layer, Ir-Y-O film 53 as the lower electrode, SBT film 56 as the ferroelectric film, and Pt film 57 as the upper electrode are sequentially deposited on the conductive Si substrate 51.

Figure 12:
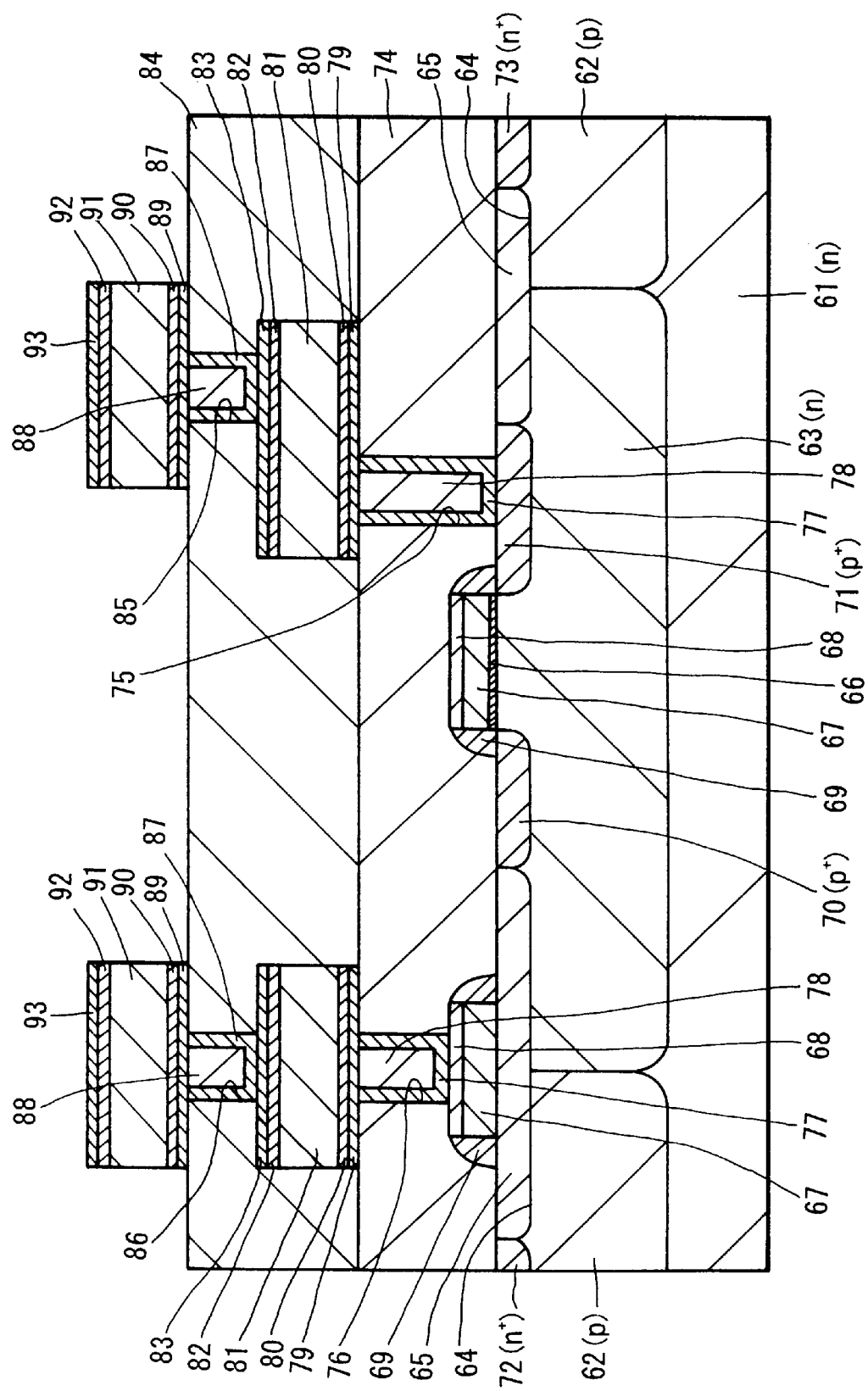
FIG. 12 is a cross-sectional view showing a semiconductor integrated circuit device according to the sixth embodiment of the invention.
Figure 13:
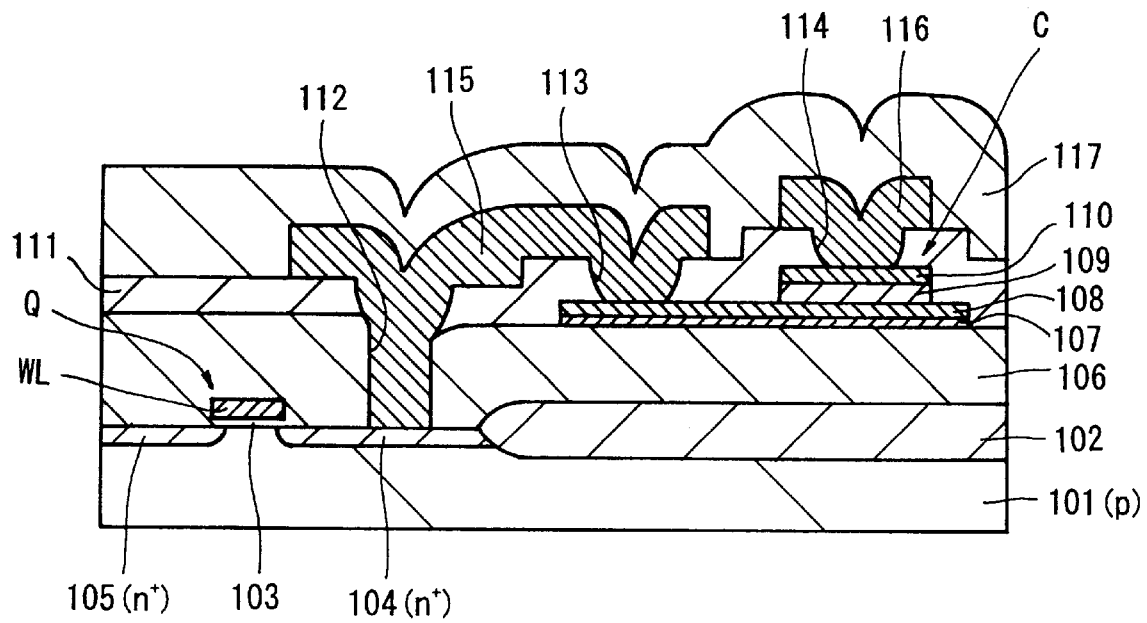
FIG. 13 is a cross-sectional view showing conventional ferroelectric memory in which a transistor and a capacitor are aligned side-by-side.
Figure 14:
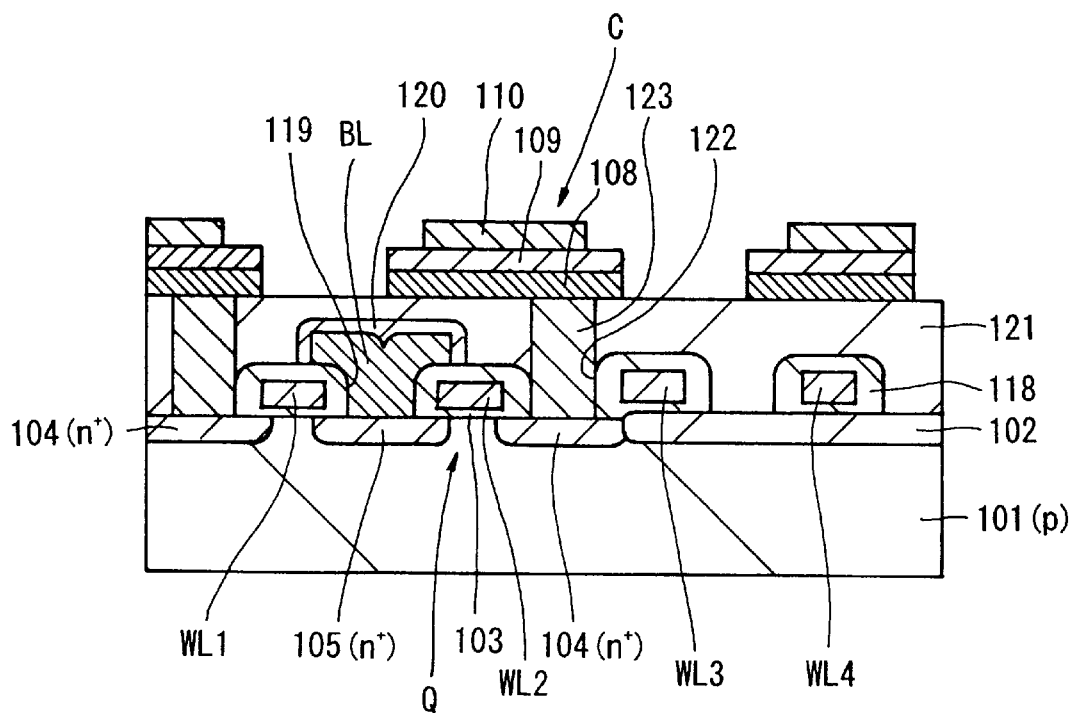
FIG. 14 is a cross-sectional view showing conventional ferroelectric memory in which a transistor and a capacitor are aligned longitudinally.
Figure 15:
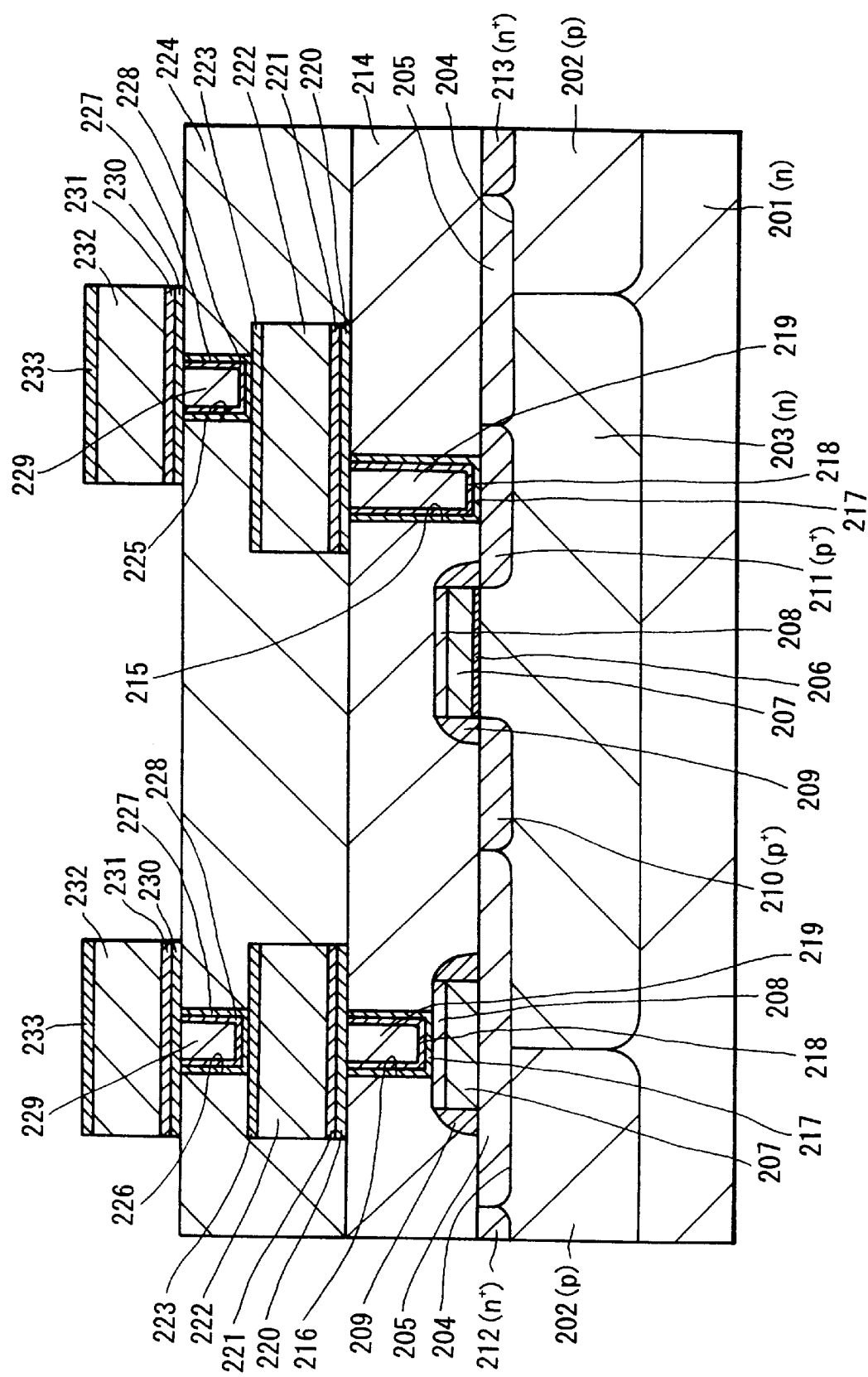
FIG. 15 is a cross-sectional view showing a conventional semiconductor integrated circuit device.

FIG. 12 shows a semiconductor integrated circuit device having a multi-layered wiring structure according to the sixth embodiment of the invention.

As shown in FIG. 12, in the semiconductor integrated circuit device according to the second embodiment, p wells 62 and n wells 63 are provided in an n-type Si substrate 61. Recesses 64 are provided on the surface of the n-type Si substrate 61 in selective portions used as device isolating regions. A field insulation film 65 made of $SiO_2$ is inlaid in the recesses 64. A gate insulation film 66 made of $SiO_2$ is provided on the surface of active regions surrounded by the field insulation film 65. Numeral 67 denotes a polycrystalline Si film doped with an impurity, and 68 is a metal silicide film such as WSi$_x$ film. The polycrystalline Si film 67 and the metal silicide film 68 form a polycide-structured gate electrode. A side wall spacer 69 made of SiO$_2$ is provided on side walls of the polycrystalline Si film 67 and the metal silicide film 68. Formed in an n well 63 are p$^+$-type diffused layers 70, 71 in self alignment with the gate electrode composed of the polycrystalline Si film 67 and the metal silicide film 68 to be used as source regions and drain regions. A gate electrode and the diffused layers 70, 71 form a p-channel MOS transistor. Similarly formed in a p-well 62 is an n-channel MOS transistor. Numerals 72 and 73 denote n$^+$-type diffused layers used as source and drain regions of the n-channel MOS transistor.

An inter-layer insulation film 74 made of boro-phospho silicate glass (BPSG), for example, is provided to cover the p-channel MOS transistor and the n-channel MOS transistor. Connection holes 75 and 76 extend through the inter-layer insulation film 74 at a portion aligned with the diffused layer 71 of the p-channel MOS transistor and a portion aligned with the gate electrode on the field insulation film 65, respectively. A W plug 78 is inlaid in the connection holes 75, 76 via an Ir-Ce-O film 77.

An Al-Cu alloy wiring 81 is provided above the connection holes 75 and 76 via an Ir-Ce-O film 79 and a Ti film 80, and another Ti film 82 and another Ir-Ce-O film 83 are deposited sequentially on the wiring 81. Numeral 84 denotes an inter-layer insulation film made of BPSG, for example. Connection holes 85 and 86 extend through the inter-layer insulation film 84 at portions aligned with the Al-Cu alloy wiring 81. A W plug 88 is inlaid inside the connection holes 85, 86 via an Ir-Ce-O film 87.

Further provided above the connection holes 85, 86 is an Al-Cu alloy wiring 91 via an Ir-Ce-O film 89 and a Ti film 90, and another Ti film 92 and another Ir-Ce-O film 93 are deposited sequentially on the wiring 91.

Compositions of the Ir-Ce-O films 77, 79, 83, 87, 89 and 93 are selected within the range shown by hatching in FIG. 4. The Ti films 80, 82 are used to ensure reliable adhesion of the Ir-Ce-O films 79, 83 to the Al-Cu alloy wiring 81. Also the Ir-Ce-O films 89, 93 on and under the Al-Cu alloy wiring 91 are used for the same purpose.

As explained above, according to the sixth embodiment, since the W plug 78 is formed in the connection holes 75, 76 via the Ir-Ce-O film 77 having a sufficiently high heat resistivity, as compared with TiN and TiON films conventionally used as barrier metals, and therefore capable of preventing diffusion of Si, or the like, even under a high temperature, the Ir-Ce film 77 alleviates restriction on the process temperature in steps after deposition of the W plug 78 and permits the process temperature and time to be selected more freely in later steps. Moreover, since this embodiment interposes the Ir-Ce-O film 79 between the W plug 78 and the overlying Al-Cu alloy wiring 81, and the Ir-Ce-O film 83 between the Al-Cu alloy wiring 81 and the overlying W plug 88, the Ir-Ce-O films 79 and 83 prevent undesired diffusion between the W plugs 78, 88 and the Al-Cu alloy wiring 81. Similarly, the Ir-Ce-O film 89 interposed between the W plug 88 and the Al-Cu alloy wiring 91 prevents undesired diffusion between the W plug 88 and the Al-Cu alloy wiring 91.

The semiconductor integrated circuit device according to the sixth embodiment is suitable for use in MOSLSI, such as DRAM and MPU, and other various semiconductor integrated circuit devices.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the first, second, fourth and fifth embodiments have been explained as using SBT as the material of the dielectric film of the dielectric capacitor; however, another ferroelectric material or a high dielectric material may be used as the material of the dielectric film, where so desired. More specifically, PZT or BST, for example, may be used.

The second embodiment has been explained as interposing Ti films 30, 32 between the Al-Cu alloy wiring 31 and the Ir-Hf-O films 29, 33, respectively, and interposing the Ti films 40, 42 between the Al-Cu alloy wiring 41 and the Ir-Hf-O films 39, 43, respectively; however, these Ti films 30, 32, 40, 42 may be omitted, if appropriate.

In the sixth embodiment, the Ir-Ce-O films 77, 79, 83, 89, 93 may be replaced with Ir-Y-O films. In the fourth embodiment, the Ir-Y-O film 53 may be replaced by an Ir-Ce-O film.

Still in the sixth embodiment, although the Ti films 80, 82 are provided between the Al-Cu alloy wiring 81 and the Ir-Ce-O films 79, 83, respectively, and the Ti films 90, 92 are provided between the Al-Cu alloy wiring 91 and the Ir-Ce-O films 89, 93, respectively, these Ti films 80, 82, 90, 92 may be omitted, where desired so.

As described above, according to the first aspect of the invention, an electronic material can be realized, which is suitable for use as the material of a diffusion preventing layer of a dielectric capacitor, as the material of a lower electrode of a dielectric capacitor or as the material of a diffusion preventing layer of a semiconductor device.

According to the second aspect of the invention, an electronic material with a high quality can be manufactured easily, which is suitable for use as the material of a diffusion preventing layer of a dielectric capacitor, lower electrode of a dielectric capacitor or a diffusion preventing layer of a semiconductor device.

According to the third, fourth, fifth or sixth aspect of the invention, since the dielectric capacitor includes the diffusion preventing layer made under the lower electrode from a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100, or alternatively, the lower electrode is made of this material, even when longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and therefore, not only PZT but also SBT, which needs high-temperature annealing in an oxygen atmosphere for crystallization, can be used as the material of the dielectric film.

According to the seventh aspect of the invention, since the dielectric capacitor includes the diffusion preventing layer made between the first conductive layer and the second conductive layer from a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and $a+b+c=100$, process temperatures and time for steps after deposition of the plug can be more freely selected from a wider range.

According to the eighth, ninth, tenth and eleventh aspects of the invention, since the dielectric capacitor includes the diffusion preventing layer made under the lower electrode thereof from a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and $a+b+c=100$, or alternatively, the lower electrode is made of this material, even when longitudinally aligning the transistor and the dielectric capacitor so as to connect the lower electrode of the dielectric capacitor to the diffused layer of the transistor by a Si or W plug, diffusion of Si or W from the plug into the lower electrode can be prevented, and therefore, not only PZT but also SBT, which needs high-temperature annealing in an oxygen atmosphere for crystallization, can be used as the material of the dielectric film.

According to the twelfth aspect of the invention, since the dielectric capacitor includes the diffusion preventing layer made under the lower electrode thereof from a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of rare earth element) having a composition within the range of $90 \geq a \geq 40$, $15 \geq b \geq 2$, $4 \leq c$ and $a+b+c=100$, process temperatures and time for steps after deposition of the plug can be more freely selected from a wider range.

What is claimed is:

1. An electronic material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and $a+b+c=100$.

2. The electronic material according to claim 1 where in said range of composition is $85 \geq a \geq 65$, $10 \geq b \geq 2$, $10 \leq c$ and $a+b+c=100$.

3. A dielectric capacitor comprising:
a diffusion preventing layer made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and $a+b+c=100$;
a lower electrode on said diffusion preventing layer;
a dielectric film on said lower electrode; and
an upper electrode on said dielectric film.

4. The dielectric capacitor according to claim 3 wherein said material expressed by $M_{Ia}M_{IIb}O_c$ has a composition within the range of $85 \geq a \geq 65$, $10 \geq b \geq 2$, $10 \leq c$ and $a+b+c=100$.

5. The dielectric capacitor according to claim 3 wherein said diffusion preventing layer is made of Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O or Rh-W-O.

6. The dielectric capacitor according to claim 3 wherein said diffusion preventing layer is deposited by reactive sputtering using oxygen or water vapor.

7. The dielectric capacitor according to claim 3 wherein said lower electrode is made of at least one sort of noble metal selected from the group consisting of Pt, Ir, Ru, Rh and Pd.

8. The dielectric capacitor according to claim 3 wherein said dielectric film is made of a Bi layer-structured perovskite-type ferroelectric material.

9. The dielectric capacitor according to claim 3 wherein said dielectric film is made of a ferroelectric material containing a crystal layer expressed by $Bi_x(Sr, Ca, Ba)_y(Ta, Nb)_2O_z$ (where $2.50 \geq x \geq 1.70$, $1.20 \geq y \geq 0.60$, $z=9 \pm d$ and $1.0 \geq d \geq 0$) by an amount not less than 85%.

10. The dielectric capacitor according to claim 3 wherein said dielectric film is made of a ferroelectric material containing a crystal layer expressed by $Bi_xSr_yTa_2O_z$ (where $2.50 \geq x \geq 1.70$, $1.20 \geq y \geq 0.60$, $z=9 \pm d$ and $1.0 \geq d \geq 0$) by an amount not less than 85%.

11. The dielectric capacitor according to claim 3 wherein said dielectric film is made of a ferroelectric material expressed by $SrBi_2Ta_2O_9$.

12. The dielectric capacitor according to claim 3 wherein said dielectric film is made of a ferroelectric material expressed by $Pb(Zr, Ti)O_3$.

13. The dielectric capacitor according to claim 3 wherein said dielectric film is made of a high dielectric material expressed by $(Ba, Sr)TiO_3$.

14. A dielectric capacitor comprising:
a lower electrode made of a material expressed by the composition formula $M_{Ia}M_{IIb}O_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and $a+b+c=100$;
a dielectric film on said lower electrode; and
an upper electrode on said dielectric film.

15. The dielectric capacitor according to claim 14 wherein said material expressed by $M_{Ia}M_{IIb}O_c$ has a composition within the range of $85 \geq a \geq 65$, $10 \geq b \geq 2$, $10 \leq c$ and $a+b+c=100$.

16. The dielectric capacitor according to claim 14 wherein said lower electrode is made of Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O or Rh-W-O.

17. The dielectric capacitor according to claim 14 wherein said lower electrode is deposited by reactive sputtering using oxygen or water vapor.

18. The dielectric capacitor according to claim 14 wherein said dielectric film is made of a Bi layer-structured perovskite-type ferroelectric material.

19. The dielectric capacitor according to claim 14 wherein said dielectric film is made of a ferroelectric material containing a crystal layer expressed by $Bi_x(Sr, Ca, Ba)_y(Ta, Nb)_2O_z$ (where $2.50 \geq x \geq 1.70$, $1.20 \geq y \geq 0.60$, $z=9 \pm d$ and $1.0 \geq d \geq 0$) by an amount not less than 85%.

20. The dielectric capacitor according to claim 14 wherein said dielectric film is made of a ferroelectric material containing a crystal layer expressed by $Bi_xSr_yTa_2O_z$ (where $2.50 \geq x \geq 1.70$, $1.20 \geq y \geq 0.60$, $z=9 \pm d$ and $1.0 \geq d \geq 0$) by an amount not less than 85%.

21. The dielectric capacitor according to claim 14 wherein said dielectric film is made of a ferroelectric material expressed by $SrBi_2Ta_2O_9$.

22. The dielectric capacitor according to claim 14 wherein said dielectric film is made of a ferroelectric material expressed by Pb(Zr, Ti)O$_3$.

23. The dielectric capacitor according to claim 14 wherein said dielectric film is made of a high dielectric material expressed by (Ba, Sr)TiO$_3$.

24. A nonvolatile memory having a memory cell composed of a transistor and a dielectric capacitor, wherein said dielectric capacitor comprises:

a diffusion preventing layer made of a material expressed by the composition formula M$_{Ia}$M$_{IIb}$O$_c$ (where a, b and c are compositions in atomic %, M$_I$ is at least one sort of noble metal selected from the group consisting of Pt, Ir, Ru, Rh and Pd, and M$_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a lower electrode on said diffusion preventing layer;

a dielectric film on said lower electrode; and an upper electrode on said dielectric film.

25. The nonvolatile memory according to claim 24 wherein said material expressed by M$_{Ia}$M$_{IIb}$O$_c$ has a composition within the range of $85 \geq a \geq 65$, $10 \geq b \geq 2$, $10 \leq c$ and a+b+c=100.

26. The nonvolatile memory according to claim 24 wherein said diffusion preventing layer is made of Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O or Rh-W-O.

27. The nonvolatile memory according to claim 24 wherein said diffusion preventing layer is deposited by reactive sputtering using oxygen or water vapor.

28. The nonvolatile memory according to claim 24 wherein said lower electrode is made of at least one sort of noble metal selected from the group consisting of Pt. Ir, Ru, Rh and Pd.

29. The nonvolatile memory according to claim 24 wherein said dielectric film is made of a Bi layer-structured perovskite-type ferroelectric material.

30. The nonvolatile memory according to claim 24 wherein said dielectric film is made of a ferroelectric material containing a crystal layer expressed by Bi$_x$(Sr, Ca, Ba)$_y$(Ta, Nb)$_2$O$_z$ (where $2.50 \geq x \geq 1.70$, $1.20 \geq y \geq 0.60$, z=9±d and $1.0 \geq d \geq 0$) by an amount not less than 85%.

31. The nonvolatile memory according to claim 24 wherein said dielectric film is made of a ferroelectric material containing a crystal layer expressed by Bi$_x$Sr$_y$Ta$_2$O$_z$ (where $2.50 \geq x \geq 1.70$, $1.20 \geq y \geq 0.60$, z=9±d and $1.0 \geq d \geq 0$) by an amount not less than 85%.

32. The nonvolatile memory according to claim 24 wherein said dielectric film is made of a ferroelectric material expressed by SrBi$_2$Ta$_2$O$_9$.

33. The nonvolatile memory according to claim 24 wherein said dielectric film is made of a ferroelectric material expressed by Pb(Zr, Ti)O$_3$.

34. The nonvolatile memory according to claim 24 wherein said dielectric film is made of a high dielectric material expressed by (Ba, Sr)TiO$_3$.

35. The nonvolatile memory according to claim 24 wherein said diffusion preventing layer is provided on a plug made of Si or W on a diffused layer of said transistor.

36. The nonvolatile memory according to claim 24 further comprising a bonding layer between said diffusion preventing layer and said lower electrode.

37. The nonvolatile memory according to claim 24 further comprising a bonding layer between said plug and said diffusion preventing layer.

38. The nonvolatile memory according to claim 36 wherein said bonding layer is made of Ti, Ta, Hf or Zr.

39. The nonvolatile memory according to claim 37 wherein said bonding layer is made of Ti, Ta, Hf or Zr.

40. A nonvolatile memory having a memory cell composed of a transistor and a dielectric capacitor, wherein said dielectric capacitor comprises:

a lower electrode made of a material expressed by the composition formula M$_{Ia}$M$_{IIb}$O$_c$ (where a, b and c are compositions in atomic %, M$_I$ is at least one sort of noble metal selected from the group consisting of Pt, Ir, Ru, Rh and Pd, and M$_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and a+b+c=100;

a dielectric film on said lower electrode; and an upper electrode on said dielectric film.

41. The nonvolatile memory according to claim 40 wherein said material expressed by M$_{Ia}$M$_{IIb}$O$_c$ has a composition within the range of $85 \geq a \geq 65$, $10 \geq b \geq 2$, $10 \leq c$ and a+b+c=100.

42. The nonvolatile memory according to claim 40 wherein said lower electrode is made of Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O or Rh-W-O.

43. The nonvolatile memory according to claim 40 wherein said lower electrode is deposited by reactive sputtering using oxygen or water vapor.

44. The nonvolatile memory according to claim 40 wherein said dielectric film is made of a Bi layer-structured perovskite-type ferroelectric material.

45. The nonvolatile memory according to claim 40 wherein said dielectric film is made of a ferroelectric material containing a crystal layer expressed by Bi$_x$(Sr, Ca, Ba)$_y$(Ta, Nb)$_2$O$_z$ (where $2.50 \geq x \geq 1.70$, $1.20 \geq y \geq 0.60$, z=9±d and $1.0 \geq d \geq 0$) by an amount not less than 85%.

46. The nonvolatile memory according to claim 40 wherein said dielectric film is made of a ferroelectric material containing a crystal layer expressed by Bi$_x$Sr$_y$Ta$_2$O$_z$ (where $2.50 \geq x \geq 1.70$, $1.20 \geq y \geq 0.60$, z=9±d and $1.0 \geq d \geq 0$) by an amount not less than 85%.

47. The nonvolatile memory according to claim 40 wherein said dielectric film is made of a ferroelectric material expressed by SrBi$_2$Ta$_2$O$_9$.

48. The nonvolatile memory according to claim 40 wherein said dielectric film is made of a ferroelectric material expressed by Pb(Zr, Ti)O$_3$.

49. The nonvolatile memory according to claim 40 wherein said dielectric film is made of a high dielectric material expressed by (Ba, Sr)TiO$_3$.

50. The nonvolatile memory according to claim 40 wherein said lower electrode is provided on a plug made of Si or W on a diffused layer of said transistor.

51. The nonvolatile memory according to claim 40 further comprising a bonding layer between said plug and said lower electrode.

52. The nonvolatile memory according to claim 51 wherein said bonding layer is made of Ti, Ta, Hf or Zr.

53. A semiconductor device comprising:

a first conductive layer;

a second conductive layer on said first conductive layer; and a diffusion preventing layer provided between said first conductive layer and said second conductive layer and made of a material expressed by the composition formula M$_{Ia}$M$_{IIb}$O$_c$ (where a, b and c are compositions in atomic %, $M_I$ is at least one sort of noble metal selected from the group consisting of Pt, Ir, Ru, Rh and Pd, and $M_{II}$ is at least one sort of transition metal selected from the group consisting of Hf, Ta, Zr, Nb, V, Mo and W) having a composition within the range of $90 \geq a \geq 40$, $15 \geq b \geq 2$, $4 \leq c$ and $a+b+c=100$.

54. The semiconductor device according to claim 53 wherein said material expressed by $M_{Ia}M_{IIb}O_c$ has a composition within the range of $85 \geq a \geq 65$, $10 \geq b \geq 2$, $10 \leq c$ and $a+b+c=100$.

55. The semiconductor device according to claim 53 wherein said diffusion preventing layer is made of Ir-Hf-O, Ir-Zr-O, Ir-Nb-O, Ru-Zr-O, Ru-Ta-O, Pt-Hf-O, Pt-Zr-O, Pd-Zr-O, Rh-V-O, Rh-Mo-O or Rh-W-O.

56. The semiconductor device according to claim 53 wherein said diffusion preventing layer is deposited by reactive sputtering using oxygen or water vapor.

57. The semiconductor device according to claim 53 wherein said first conductive layer is a diffused layer made of Si, and said second conductive layer is a plug made of conductive material.

58. The semiconductor device according to claim 57 wherein said plug is made of Si, W or Al.

59. The semiconductor device according to claim 53 wherein said first conductive layer is a plug made of a conductive material, and said second conductive layer is an Al alloy wiring.

60. The semiconductor device according to claim 59 wherein said plug is made of Si, W or Al.

61. The semiconductor device according to claim 53 wherein said first conductive layer is an Al alloy wiring, and said second conductive layer is a plug made of a conductive material.

62. The semiconductor device according to claim 61 wherein said plug is made of Si, W or Al.

* * * * *